(12) United States Patent
Sanders et al.

(10) Patent No.: US 9,223,209 B2
(45) Date of Patent: Dec. 29, 2015

(54) SULFONAMIDE-CONTAINING PHOTORESIST COMPOSITIONS AND METHODS OF USE

(75) Inventors: Daniel Paul Sanders, San Jose, CA (US); Masaki Fujiwara, Cupertino, CA (US); Yoshiharu Terui, San Jose, CA (US)

(73) Assignees: International Business Machines Corporation, Armonk, NY (US); Central Glass Co., Ltd., Tokyo (JP)

( * ) Notice: Subject to any disclaimer, the term of this patent is extended or adjusted under 35 U.S.C. 154(b) by 480 days.

(21) Appl. No.: 12/709,346

(22) Filed: Feb. 19, 2010

(65) Prior Publication Data

US 2011/0207052 A1    Aug. 25, 2011

(51) Int. Cl.
*G03F 7/039* (2006.01)
*G03F 7/20* (2006.01)
*G03F 7/004* (2006.01)
*G03F 7/11* (2006.01)
*G03F 7/32* (2006.01)

(52) U.S. Cl.
CPC ............ *G03F 7/0046* (2013.01); *G03F 7/0392* (2013.01); *G03F 7/0397* (2013.01); *G03F 7/11* (2013.01); *G03F 7/2041* (2013.01); *G03F 7/322* (2013.01); *G03F 7/325* (2013.01)

(58) Field of Classification Search
CPC ....... G03F 7/004; G03F 7/0046; G03F 7/039; G03F 7/0392; G03F 7/20; G03F 7/2041
USPC ............................................. 430/270.1, 326
See application file for complete search history.

(56) References Cited

U.S. PATENT DOCUMENTS

| | | | |
|---|---|---|---|
| 3,629,332 A | | 12/1971 | Harrington et al. |
| 3,766,193 A | | 10/1973 | Harrington et al. |
| 6,127,331 A | * | 10/2000 | Cleary et al. ................ 510/528 |
| 6,165,678 A | | 12/2000 | Allen et al. |
| 6,177,228 B1 | | 1/2001 | Allen et al. |
| 6,399,277 B1 | | 6/2002 | Nojima et al. |
| 6,949,325 B2 | | 9/2005 | Li et al. |
| 7,063,931 B2 | | 6/2006 | Li et al. |
| 7,115,771 B2 | | 10/2006 | Komata et al. |
| 7,335,456 B2 | | 2/2008 | Li et al. |
| 7,550,630 B2 | | 6/2009 | Matsunaga et al. |
| 2002/0177743 A1 | * | 11/2002 | Dahl et al. ................... 585/16 |
| 2003/0199710 A1 | * | 10/2003 | Liu et al. ..................... 562/498 |
| 2003/0207139 A1 | * | 11/2003 | Tsutsumi et al. ............ 428/523 |
| 2005/0003303 A1 | | 1/2005 | Watanabe et al. |
| 2005/0058930 A1 | * | 3/2005 | Li et al. ..................... 430/270.1 |
| 2005/0153232 A1 | | 7/2005 | Li et al. |
| 2005/0202351 A1 | * | 9/2005 | Houlihan et al. ............ 430/322 |
| 2006/0216643 A1 | | 9/2006 | Li et al. |
| 2007/0117031 A1 | | 5/2007 | Mizukawa et al. |
| 2007/0254235 A1 | | 11/2007 | Allen et al. |
| 2008/0038661 A1 | | 2/2008 | Chiba et al. |
| 2008/0038676 A1 | | 2/2008 | Li et al. |
| 2008/0081329 A1 | * | 4/2008 | Elliott et al. ................. 435/6 |
| 2008/0182906 A1 | | 7/2008 | Lardy et al. |
| 2008/0187860 A1 | * | 8/2008 | Tsubaki et al. ............ 430/270.1 |
| 2008/0207721 A1 | | 8/2008 | Berger et al. |
| 2009/0023903 A1 | | 1/2009 | Connolly et al. |
| 2009/0069595 A1 | | 3/2009 | Komata et al. |
| 2009/0227667 A1 | | 9/2009 | Kreft et al. |
| 2010/0003615 A1 | * | 1/2010 | Nakamura et al. ......... 430/270.1 |
| 2011/0111342 A1 | | 5/2011 | Ichikawa et al. |
| 2011/0207051 A1 | | 8/2011 | Sanders et al. |

FOREIGN PATENT DOCUMENTS

| | | |
|---|---|---|
| CN | 1637603 A | 7/2005 |
| CN | 1846169 A | 10/2006 |
| CN | 1930524 A | 3/2007 |
| EP | 1950610 A1 | 7/2008 |
| JP | 2005023304 A | 1/2005 |

(Continued)

OTHER PUBLICATIONS

Sanders et al., U.S. Appl. No. 12/709,277, filed Feb. 19, 2010.
International Search Report for PCT/EP2011/05156 mailed from the ISR on Oct. 12, 2011.
Li et al, "High Performance 193nm Photoresists Based on Fluorosulfonamide" Proc. of SPIE 6519: 65190F (2007).
Sunberg et al, "Contact Angles & Structure/Surface Property Relationships of Immersion Materials," Proc. of SPIE 6519: 65191Q (2007).
Varanasi et al, "Exploring Acidic Functionalities in the Design and Development of High Performance 193nm Photoresist Polymers," Journal of Photopolymer Science and Technology, vol. 20, No. 4, pp. 481-491 (2007).

(Continued)

*Primary Examiner* — Anca Eoff
(74) *Attorney, Agent, or Firm* — Karen Canaan; CanaanLaw, P.C.

(57) ABSTRACT

Provided are sulfonamide-containing photoresist compositions for use in lithographic processes that have improved properties for high resolution, low blur imaging. Also provided are alcohol-soluble photoresists for resist-on-resist applications. The sulfonamide-containing photoresist compositions of the present invention include positive-tone photoresist compositions that have sulfonamide-substituted repeat units with branched linking group as shown in Formula (I):

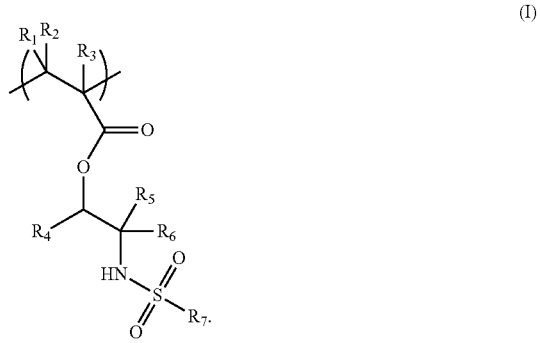

42 Claims, 5 Drawing Sheets

(56) References Cited

FOREIGN PATENT DOCUMENTS

| | | |
|---|---|---|
| JP | 2005196209 A | 7/2005 |
| JP | 2007191566 A | 8/2007 |
| JP | 2007525696 A | 9/2007 |
| JP | 2007316448 A | 12/2007 |
| JP | 2009237379 A | 10/2009 |
| JP | 2011121938 A | 6/2011 |
| JP | 2011123480 A | 6/2011 |
| JP | 2011252145 A | 12/2011 |
| JP | 2011253179 A | 12/2011 |
| JP | 2012012572 A | 1/2012 |
| JP | 2012144734 A | 8/2012 |
| JP | 2013519923 A | 5/2013 |
| KR | 20080056321 A | 6/2008 |
| TW | 2011126266 A | 8/2011 |
| TW | 1418942 B | 12/2013 |
| WO | WO 2007/049637 * | 5/2007 |

OTHER PUBLICATIONS

Yadav et al., Indium Triflate-Catalyzed Ring Opening of Aziridines with Carboxylic Acids, Tetrahedron Letters 43: 2099-2101 (2001).

Office Action dated Jan. 4, 2012 for U.S. Appl. No. 12/709,277 (US Pub. 2011/0207051 A1 to Sanders et al.).

Final Office Action dated Apr. 20, 2012 for U.S. Appl. No. 12/709,277 (US Pub. 2011/0207051 A1 to Sanders et al.).

International Search Report and Written Opinion for PCT/EP2011/051564 mailed from the ISA on Dec. 30, 2011.

* cited by examiner

| Material SRCA | Poly(EATf-MA) | Poly(1,4-CHTf-MA) | Poly(AMNB-Tf-MA) | Poly(NBHFAMA) | Poly(MA-BTHB-OH) |
|---|---|---|---|---|---|
| TMAH dissolution rate | 47° | 48° | 56° | 65° | 70° |
| | 3000 nm/s | 220 nm/s | 150 nm/s | 0.4 nm/s | 145 nm/s |
| $T_g$ | 73 °C | 180 °C | 148 °C | 159 °C | 104 °C |

FIG. 1

| Material SRCA | Poly(1-Me-EATf-MA) | Poly(1-Et-EATf-MA) | Poly(2-Me-EATf-MA) | Poly(2-Et-EATf-MA) |
|---|---|---|---|---|
| TMAH dissolution rate | 1100 nm/s | 455 nm/s | 1270 nm/s | 430 nm/s |
| $T_g$ | 109 °C | 101 °C | 82 °C | 111 °C |

| Material SRCA | Poly(2-TFE-EATf-MA) | Poly(2-iPr-EATf-MA) | Poly(2-iBu-EATf-MA) | Poly(2,2-DiMe-EATf-MA) |
|---|---|---|---|---|
| TMAH dissolution rate | 410 nm/s | 220 nm/s | 118 nm/s | 920 nm/s |
| $T_g$ | 61° / 61 °C | 66° / 120 °C | 71° / 114 °C | 71° / 122 °C |

FIG. 2

SULFONAMIDE-CONTAINING PHOTORESIST COMPOSITIONS AND METHODS OF USE

TECHNICAL FIELD

The invention relates generally to photoresist compositions. The invention more specifically relates to sulfonamide-containing positive-tone photoresist compositions with improved properties for high resolution, low blur imaging, and alcohol-soluble positive-tone photoresists for double patterning applications.

BACKGROUND OF THE INVENTION

Photoresists incorporating fluoroalcohols, in particular 1,1,1,3,3,3-hexafluoroisopropan-2-ol-2-yl groups (so-called hexafluoroalcohols (HFAs)) or sulfonamide groups have been reported for 193 nm lithography. The incorporation of HFA or sulfonamide groups into the photoresist resin can improve various aspects of lithographic patterning performance. In particular HFA- and sulfonamide-based resists feature lower swelling in the partially exposed areas (e.g., at line edges) in comparison with materials using more hydrophilic acidic groups such as carboxylic acid groups. For examples of HFA-based resists, see Ito et al., *Polym. Adv. Technol.* 17:104 (2006) and Varanasi et al., *J. Photopolymer Sci. Technol.* 18:381 (2005). For examples of sulfonamide-based resists, see Varanasi et al., *J. Photopolymer Sci. Technol.* 20:481 (2007) and Li et al., *Proc. SPIE* 6519:65190 E-1 (2007). In addition to applications in single-layer photoresists, there is increasing interest in alcohol-soluble photoresists that can be spun cast onto a previously patterned photoresist without dissolving the underlying pattern. For these applications, the quantity of a HFA or sulfonamide-based monomer in the photoresist polymer can reach levels of up to 50% or more. In such applications, the low glass transition temperature, high alkali dissolution rate, and low etch resistance of EATf-MA (see, e.g., poly(EATF-MA in FIG. 1) limits its application in high-resolution photoresists. Alternatively, polymers based on AMNB-Tf-MA with its cyclic linking group offer higher etch resistance, higher glass transition temperatures, and more moderate alkali dissolution rates; however, this monomer is more complicated to synthesize and can consist of a complex mixture of isomers. As a result, there is still a need for new monomers and photoresist materials with improved properties for high resolution, low blur imaging and for alcohol-soluble photoresists for double patterning applications.

SUMMARY OF THE INVENTION

The present invention overcomes the need in the art by providing sulfonamide-containing positive-tone photoresist compositions comprising repeat units having a sulfonamide group and a branched linking group.

In one embodiment of the present invention, there is provided a positive-tone photoresist composition comprising a polymer, a PAG, and a solvent, wherein the polymer includes a first repeat unit having a sulfonamide group and a branched linking group and a second repeat unit that includes an acidic group protected by an acid-labile protecting group.

In another embodiment, the branched sulfonamide-substituted repeat unit has a structure according to Formula (I)

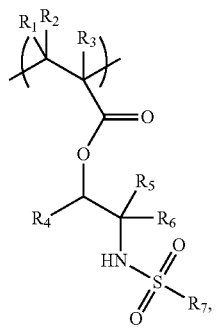

(I)

wherein R1 and R2 are independently selected from the group consisting of hydrogen, fluorine, methyl, and trifluoromethyl; R3 is selected from the group consisting of hydrogen, a halogen, C1-C12 alkyl, and fluorinated C1-C12 alkyl; R4, R5, and R6 are independently selected from hydrogen, fluorine, C1-C12 alkyl, and fluorinated C1-C12 alkyl; R7 is fluorinated C1-C12 alkyl; and at least one of R4, R5, and R6 includes carbon.

In another embodiment, R7 is selected from trifluoromethyl and perfluorobutyl.

In a further embodiment, the sulfonamide-substituted repeat unit is one of Formulas (X), (XI), (XII), and (VI).

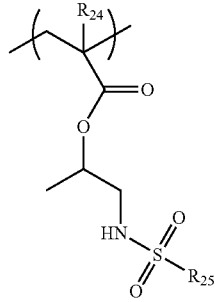

(X)

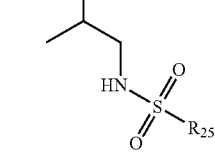

(XI)

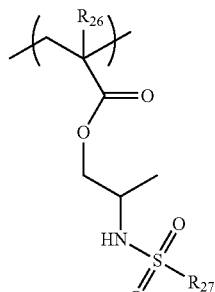

(XII)

-continued (VI)

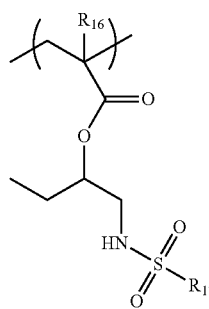

In another embodiment, the acid-labile, branched sulfonamide-substituted repeat unit is selected from the group consisting of Formulas (IV) and (VII)-(IX).

(IV)

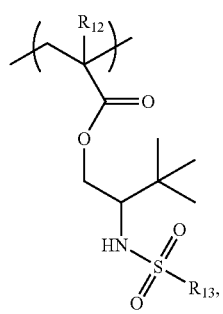

(VII)

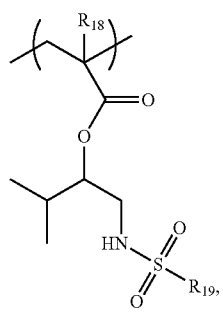

(VIII)

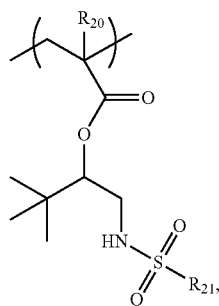

(IX)

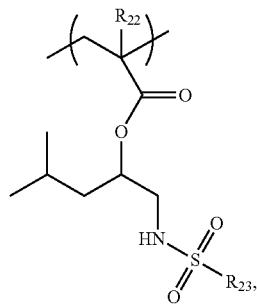

In yet another embodiment, the acid-labile, branched sulfonamide-substituted repeat unit is selected from the group consisting of Formulas (II), (III), (V), and (XIII)

(II)

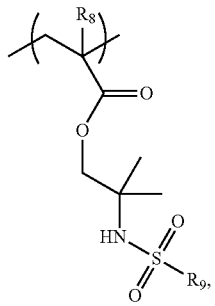

(III)

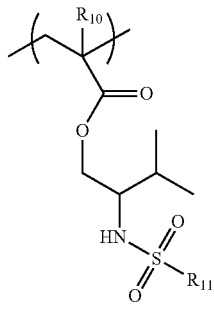

(V)

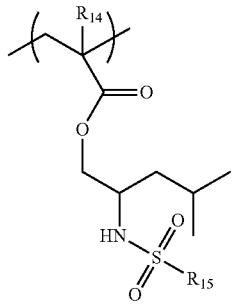

, and (XIII)

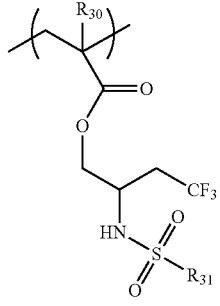

In one embodiment of the invention, R8, R10, R12, R14, R16, R18, R20, R22, R24, R26, R28, and R30 are independently selected from the group consisting of hydrogen, fluorine, methyl, and trifluoromethyl; and R9, R11, R13, R15, R17, R19, R21, R23, R25, R27, R29, and R31 are independently fluorinated C1-C12 alkyl.

In another embodiment, R9, R11, R13, R15, R17, R19, R21, R23, R25, R27, R29, and R31 are independently selected from trifluoromethyl and perfluorobutyl.

In one embodiment, the first repeat unit constitutes at least 5 mole % of the polymer.

In another embodiment, the acidic group is selected from the group consisting of carboxylic acids, sulfonamides, phenols, and fluoroalcohols.

In a further embodiment, the protecting group is selected from the group consisting of tertiary esters, orthoesters, acetals, ketals, carbonates, silyl ethers, and silyl esters.

In another embodiment of the present invention, there is provided a method of patterning a positive-tone photoresist comprising the steps of: (a) applying a layer of the positive-tone photoresist of the present invention on a substrate; (b) optionally, baking the positive-tone photoresist; (c) patternwise exposing the positive-tone photoresist; (d) optionally, baking the exposed positive-tone photoresist; and (e) developing the positive-tone photoresist to selectively remove portions of the positive-tone photoresist.

In a further embodiment of the invention, there is provided a method of patterning a positive-tone photoresist comprising the steps of: (a) applying a layer of the positive-tone photoresist of the present invention on a substrate; (b) optionally, baking the positive-tone photoresist; (c) applying a layer of topcoat material to form a topcoat on the positive-tone photoresist; (d) optionally, baking the topcoat; (e) patternwise exposing the positive-tone photoresist; (f) optionally, baking the exposed positive-tone photoresist; and (g) developing the positive-tone photoresist to selectively remove the topcoat material and portions of the positive-tone photoresist.

In one embodiment, the substrate comprises a patterned photoresist.

In another embodiment, the patternwise exposure is carried out using 193 nm water immersion lithography.

In a further embodiment, the positive-tone photoresist is developed using an aqueous alkaline developer to selectively remove the exposed portions of the photoresist to form a positive-tone image.

In another embodiment, the positive-tone photoresist is developed using an organic solvent to selectively remove the exposed portions of the positive-tone photoresist to form a positive-tone image.

In a further embodiment, the positive-tone photoresist is developed using an organic solvent to selectively remove the unexposed portions of the positive-tone photoresist to form a negative-tone image.

BRIEF DESCRIPTION OF THE DRAWINGS

FIG. 1 shows a comparison of the static receding contact angle (SRCA), TMAH dissolution rate, and glass transition temperature ($T_g$) of known sulfonamide- and hexafluoroalcohol-based methacrylate homopolymers.

FIG. 2 shows a comparison of the static receding contact angle (SRCA), TMAH dissolution rate, and glass transition temperature ($T_g$) of sulfonamide-based methacrylate homopolymers with branched linking groups of the present invention.

DETAILED DESCRIPTION OF THE INVENTION

Figure 3:
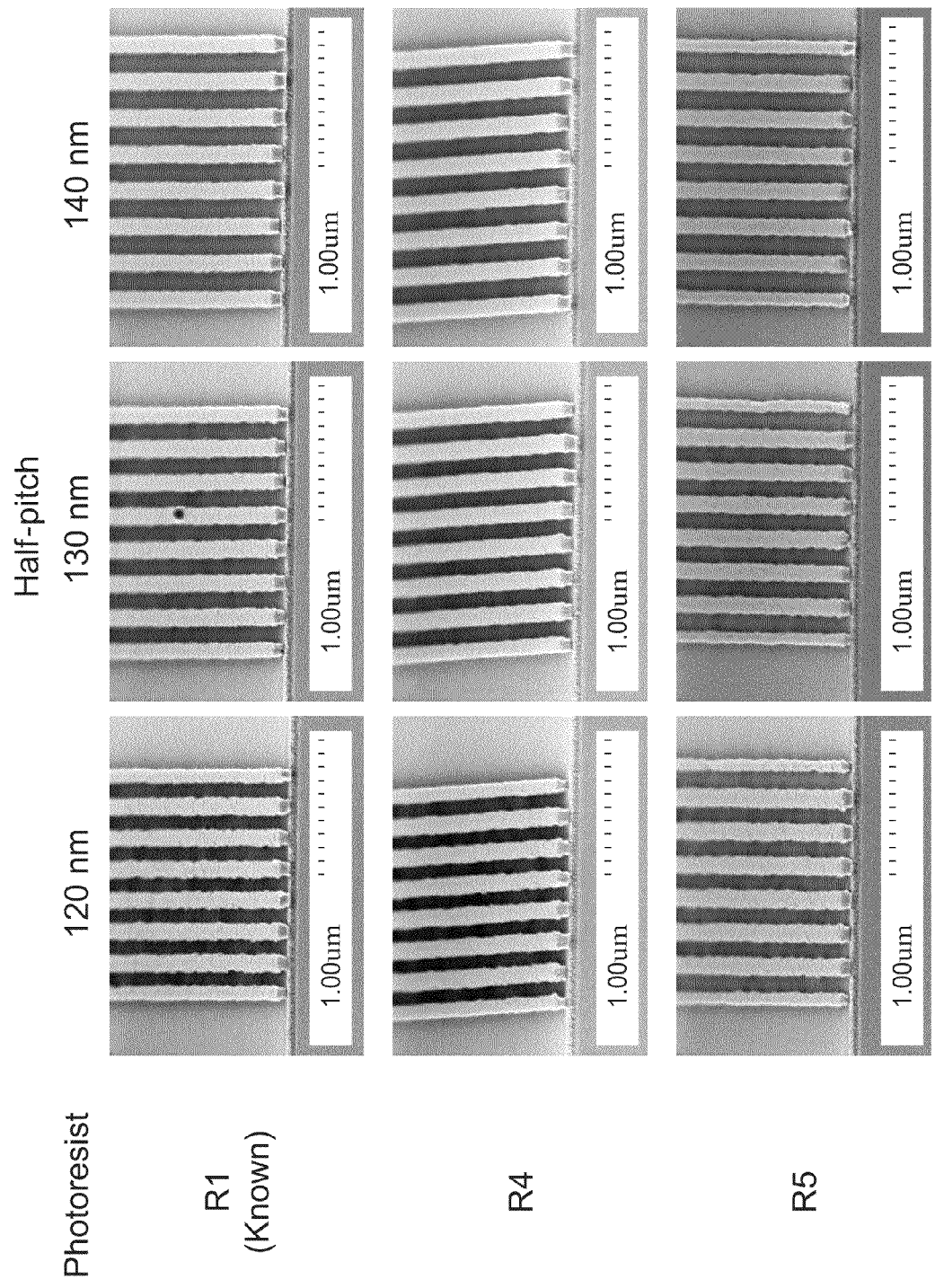
FIG. 3 is a collection of scanning electron micrographs showing imaging of photoresists of the present invention based on 2-methyladamantyl methacrylate.

Set forth below is a description of what are currently believed to be preferred embodiments of the claimed invention. Any alternates or modifications in function, purpose, or structure are intended to be covered by the claims of this application. As used in this specification and the appended claims, the singular forms "a," "an," and "the" include plural referents unless the context clearly dictates otherwise. The terms "comprises" and/or "comprising," as used in this specification and the appended claims, specify the presence of stated features, steps, elements, materials, and/or groups, but do not preclude the presence or addition of one or more other features, steps, elements, materials, and/or groups thereof.

The term "positive-tone photoresist(s)" are herein defined as photoresist material(s) that are insoluble in aqueous alkaline developer (e.g., 0.26N aqueous tetramethylammonium hydroxide (TMAH)) in their unexposed state and become soluble in aqueous alkaline developer after exposure and an optional post exposure bake.

As used herein, the term "branched linking group" is used to refer to a non-linear and non-cyclic linking group that links the sulfonamide group to the methacrylate group on the polymeric compositions of the present invention. The "branched linking group" will necessarily have at least one methyl group in the branched structure. It is to be understood that the at least one methyl group may include any methyl-containing group, such as methyl, ethyl, n-propyl, isobutyl, n-butyl, isobutyl, t-butyl, octyl, decyl, tetradecyl, hexadecyl, eicosyl, tetracosyl, and the like. Alternatively, the at least one methyl group may include functionalized methyl groups, such as trifluoromethyl, trifluoroethyl, perfluoropropyl, perfluorobutyl, or any other non-cyclic fluorinated alkyl groups. With reference to Formula (I), shown supra, R4, R5, and R6 comprise the branched linking group, wherein at least one of R4, R5, and R6 includes carbon.

The term "fluorinated C1-C12 alkyl" as used herein is meant to include perfluorinated C1-C12 alkyl, such as trifluoromethyl and perfluorobutyl, without limitation.

The term "optional" or "optionally" as used herein is used to refer to a circumstance that may or may not occur. For example, in the lithographic methods described herein, the term "optionally, baking the topcoat polymer," "optionally, baking the exposed photoresist," or "optionally, baking the exposed photoresist" means that the topcoat polymer and/or the photoresist may or may not be baked within the described method.

The term "chemical amplification" is well known in the art of photoresists, and refers to the catalytic reaction of functional groups of the photoresist as catalyzed by a photogenerated species. The fundamentals of chemical amplification and its application to photoresist chemistry are reviewed by Ito in "Chemical Amplification Resists for Microlithography" *Adv. Polym. Sci.*, vol. 172, pp. 37-245 (2005). The most common chemically-amplified photoresists utilize photoacid generators (PAGs), and the most commonly employed reaction mechanism is the acid-catalyzed deprotection of protected acidic functional groups.

A "positive-tone photoresist" refers to a photoresist that becomes more soluble in an alkaline developer when exposed to radiation. The positive-tone photoresist does not crosslink when it is exposed, developed, or when optionally baked before or after development. By contrast, a "negative-tone photoresist" refers to a photoresist that becomes less soluble in an alkaline developer when exposed to radiation, typically due to a photo-induced crosslinking mechanism.

The term "negative-tone development" means that the non-exposed areas of the photoresist layer are removed during development. The term "positive-tone development" means the exposed areas of the photoresist layer are removed during development.

It is to be understood that in some cases (e.g., when forming dense, high resolution patterns) all of the photoresist layer can receive some dose of radiation exposure. The term "non-exposed photoresist" refers to the portion of a photoresist layer that has received insufficient dose to switch the solubility of the photoresist, either before or after an optional bake, in a given developer compared to the pre-exposed photoresist. By contrast, an "exposed photoresist" has received sufficient exposure to switch the solubility of the photoresist, either before or after an optional bake, in a given developer compared to the pre-exposed photoresist.

The present invention provides sulfonamide-functionalized acrylic polymers with branched linking groups (see, FIG. 2) with increased hydrophobicity, increased glass transition temperature, and moderate dissolution rate relative to known sulfonamide materials.

The inventive sulfonamide-based methacrylate materials with branched linking groups display static, receding contact angle (SRCA) values significantly higher than poly(EATf-MA), poly(1,4-CHTf-MA) or poly(AMNB-Tf-MA), and even that of the HFA-based poly(MA-BTHB-OH) and poly(NBHFAMA) materials. Additionally, the glass transition temperatures are increased and the TMAH dissolution rates decreased as the size of the branched linking group becomes larger. In particular, the glass transition temperatures are typically increased well above that of poly(EATf-MA). Importantly, the glass transition temperatures of these materials now exceed that of common post exposure bake (PEB) temperatures used for resists with low activation energy protecting groups (e.g., 90-100° C.). The ability to perform a PEB at a temperature below the glass transition temperature of the photoresist is necessary to reduce acid diffusion and, thereby, reduce image blur and increase resolution. Advantageously, the higher glass transition temperatures enabled by these new monomers now allow alcohol-soluble photoresist materials to be designed that contain large amounts of these sulfonamide-based monomers and still have a glass transition temperature higher than the necessary PEB temperature, whereas the low Tg of EATF-MA rendered this impossible. Alcohol-soluble photoresists are desirable for resist-on-resist double patterning schemes in which one photoresist must be applied onto an existing photoresist pattern without dissolving or otherwise distorting it. Traditional photoresists require casting solvents such as propylene glycol methyl ether acetate (PGMEA) which would dissolve, swell, or distort patterns consisting of traditional photoresist materials. The polarity and dissolution rate of the sulfonamide-based monomer may be varied by changing the branched linking group in order to precisely tune photoresist performance.

In one embodiment, the present invention comprises a positive-tone photoresist composition comprising a polymer, a PAG, and a solvent, wherein the polymer includes a first repeat unit having a sulfonamide group and a branched linking structure and a second repeat unit that includes an acidic group protected by an acid-labile protecting group. In a further embodiment, the repeat unit has a structure according to one of Formulas (VI) and (X)-(XII). In another embodiment, the repeat unit is selected from the group consisting of Formulas (IV) and (VII)-(IX). In a further embodiment, the repeat unit is selected from the group consisting of Formulas (II), (III), (V), and (XIII). In still another embodiment, the first repeat unit constitutes at least 5 mole % of the polymer. The repeat unit may constitute from 5 to 70 mole % of the polymer, more particularly 10-50 mole % of the polymer, and most particularly 15-40 mole % of the polymer. As will be appreciated by those of skill in the art, the mole % of the repeat unit will depend upon the type of comonomers (if any) that are used to prepare the compositions of the present invention (see Examples 5-11).

Suitable acidic functional groups in chemically amplified photoresists include carboxylic acids, sulfonamides, phenols, fluoroalcohols, and other acidic groups, which can be deprotonated by and rendered soluble in alkaline photoresist developers. For example, acid-sensitive esters can be catalytically converted to carboxylic acid groups by a photo-released acid. Chemical amplification typically occurs during a post-exposure bake, when one photo-generated acid molecule catalyzes the deprotection of many protecting groups in the exposed areas. The resulting deprotected photoresist has increased solubility in alkaline photoresist developer compared to the as-exposed photoresist or the non-exposed photoresist. A large number of suitable acid-labile protecting groups for acidic functional groups are described in Wuts and Greene, *Greene's Protective Groups in Organic Synthesis*, 4$^{th}$ ed. John Wiley & Sons; (Hoboken, N.J., 2007) and Kocienski, *Protecting Groups*, 3$^{rd}$ ed. Georg Thieme Verlag (Stuttgart, Germany, 2005). In particular, the protecting groups include tertiary esters, orthoesters, acetals, ketals, carbonates, silyl ethers, and silyl esters.

Suitable second repeat units bearing protected acidic groups may be derived from comonomers including methacrylate, α-(trifluoromethyl)acrylate, α-(fluoro)acrylate, and acrylate monomers in which the acidic group (either the carboxylic acid of the acrylic structure itself or an acidic functionality on a substituent group of the monomer) is protected with an acid-labile protecting group. Alternative comonomers include those based on cyclic olefin (e.g., norbornene-based) monomers, vinyl ether monomers, styrenic monomers, olefin and diene monomers (e.g. those containing one or more unsaturated alkene groups). Many examples of repeat units comprising an acidic group protected with an acid-labile protecting group suitable for use in chemically-amplified 248 nm, 193 nm, 157 nm, EUV, and e-beam photoresists can be found in Ito in "Chemical Amplification Resists for Microlithography" *Adv. Polym. Sci.* 172:37-245 (2005).

The photoresist can comprise a polymer having repeating units derived from one or more monomer units comprising, in particular, a tertiary ester moiety. Examples of tertiary ester moieties include those that can be deprotected by an acid generated from a photoacid generator (PAG) such as those disclosed in U.S. Pat. No. 4,491,628, "Positive- and Negative-working Resist Compositions with Acid Generating Photoinitiator and Polymer with Acid Labile Groups Pendant from Polymer Backbone" to Ito, et al. Non-limiting examples of tertiary ester moieties include ester derivatives of structural groups such as: methyladamantane, ethyladamantane, methylcyclopentane, ethylcyclopentane, methylcyohexane, ethylcycohexane, methylcycloheptane, ethylcycloheptane, methylcyclooctane, and ethylcyclooctane. Other tertiary esters include trityl esters, isobornyl esters, dicyclopropylmethyl esters, dimethylcyclopropylmethyl esters, and t-butyl esters.

Repeating units can comprise a wide range of other acid labile groups, including for example, tertiary carbonates of phenols, benzyl esters, benzhydryl esters, acetals, ketals, trialkylsilyl esters such as trimethylsilyl ester, tetrahydrofuranyl esters, tetrahydropyranoyl esters, 3-oxocyclohexanonyl, and mevalonic lactonyl esters, and the like.

If necessary or desirable, the photoresist polymer can also have additional repeating units for such purposes as increasing etch resistance, altering the optical properties, improving adhesion to the substrate, increasing contrast, reducing swelling, and, in general, improving lithographic performance. Examples of repeat units suitable for these purposes in chemically-amplified resists for use at 248 nm, 193 nm, 157 nm, EUV, and e-beam lithography can be found in Ito, "Chemical Amplification Resists for Microlithography" *Adv. Polym. Sci.* 172:37-245 (2005).

The photoresist polymer can also have additional repeating units comprising a lactone moiety, where such inclusion can impart good lithographic performance to the photoresist. When desirable, lactone moieties can improve dissolution in aqueous developer. Examples of repeating units containing lactones moieties include 5-methacryloyloxy-2,6-norbornanecarbo-gamma-lactone, 3-methacryloyloxymethyl-2,6-norbornanecarbolactone, 3-acryloyloxymethyl-2,6-norbornanecarbo lactone, alpha-acryloyloxy-gamma-butyrolactone, alpha-methacryloyloxy-gamma-butyrolactone, beta-acryloyloxy-gamma-butyrolactone and beta-methacryloyloxy-gamma-butyrolactone.

The photoresist polymer can be a copolymer, a terpolymer, or a tetrapolymer. The photoresist can also comprise a blend of two or more polymers.

The positive-tone photoresist may be sensitive to ultraviolet radiation (e.g., i-line or g-line), deep ultraviolet radiation (e.g., wavelength <260 nm), extreme ultraviolet radiation, or electron beam radiation. In one embodiment, the positive-tone photoresist formulation is a chemical amplification photoresist that is sensitive to shorter wavelength ultraviolet radiation (e.g., <260 nm wavelength) or to extreme ultraviolet radiation (EUV) or electron beam radiation. In particular, the photoresist may be sensitive to wavelengths including 254 nm, 248 nm, 193 nm, 157 nm, and 13.5 nm.

The positive-tone photoresist polymer or oligomer in the photoresist formulation can represent up to about 99 percent by weight of the solids included in the formulation, and the photoacid generator can represent between about 0.1 percent by weight and about 25 percent by weight of the solids contained in the photoresist formulation.

Typical polymers and oligomers used in positive-tone photoresist formulations include acrylates, methacrylates, cycloolefin polymers, cycloolefin maleic anhydride copolymers, cycloolefin vinyl ether copolymers, siloxanes, silsesquioxanes, and carbosilanes. The oligomers include polyhedral oligomeric silsesquioxanes, carbohydrates, and other cage compounds. These polymers or oligomers are appropriately functionalized with aqueous base soluble groups, acid-labile groups, polar functionalities, and silicon containing groups as needed. Examples of polymers and comonomers suitable for chemically amplified positive-tone photoresists are described in H. Ito, "Chemical Amplification Resists for Microlithography," *Advances in Polymer Science* 172:37-245 (2005).

The inventive positive-tone photoresist polymers or oligomers may be synthesized by any known technique including anionic, free-radical polymerization, and controlled radical polymerization. Controlled free radical polymerization includes atom transfer radical polymerization (ATRP), nitroxide mediated polymerization (NMP), reversible addition fragmentation chain transfer (RAFT) polymerization, group transfer polymerization (GTP), catalytic chain transfer (CCT) polymerization, and other known methods. The inventive photoresist polymers or oligomers may have linear, branched, hyperbranched, dendritic, cyclic, or other topologies. The inventive materials may comprise oligomers or polymers with random, alternating, gradient, and other statistical distributions of the various comonomers. In addition, the inventive photoresist polymers or oligomers may comprise oligomers or polymers with block, multiblock, graft, or other architectures. The properties of the photoresist polymers or oligomers may also be tailored by controlling the molecular weight, molecular weight distribution (i.e., polydispersity), and the end groups. Molecular weights may range from 500 g/mol to 250,000 g/mol, preferably from 1000 g/mol to 100,000 g/mol, more preferably from 2000 g/mol to 50,0000 g/mol, and even more preferably from 5000 g/mol to 30000 g/mol. The polydispersity index (PDI), which is the ratio of the weight average molecular weight to the number average molecular weight of the polymer (i.e., $M_w/M_n$), may range from 1 to 10, more preferably from 1 to 2, and more preferably from 1 to 1.5.

The end groups may be manipulated by the choice of initiating species. For example, selection of the appropriate azo or peroxide initiators determines some of the end groups in polymers made by free-radical polymerization. Chain transfer agents such as thiols can be added to free-radical polymerization to lower the molecular weight of the polymers and add specific end groups to the polymer chains. Alternatively, specific RAFT polymerization, ATRP, or NMP initiator molecules can be used which will add a particular end group at the beginning of each chain. In addition, polymers formed by such controlled radical polymerization techniques have an active group at the chain end, which may be substituted to install a wide range of functionalities as polymer end groups.

These and other methods may be used to tailor the photoresist polymers or oligomers to improve lithographic performance.

The positive-tone photoresist formulation typically also comprises a photoacid generator (PAG). The photoacid generator may be any compound that, upon exposure to radiation, generates a strong acid and is compatible with the other components of the photoresist formulation. Examples of photochemical acid generators (PAGs) include, but are not limited to, sulfonates, onium salts, aromatic diazonium salts, sulfonium salts, diaryliodonium salts, and sulfonic acid esters of N-hydroxyamides or N-hydroxyimides, as disclosed in U.S. Pat. No. 4,371,605 to Renner. Any PAG(s) incorporated into the present photoresists should have high thermal stability, i.e., be stable to at least 140° C., so they are not degraded during pre-exposure processing.

Any suitable photoacid generator can be used in the photoresist formulations of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane;

(4) trifluoromethanesulfonate esters of imides and hydroxyimides, e.g., α-(trifluoromethylsulfonyloxy)-bicyclo[2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);
(8) naphthoquinone-4-diazides;
(9) alkyl disulfones;
(10) s-triazine derivatives, as described in U.S. Pat. No. 4,189,323 to Buhr; and
(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al., *Chemistry of Materials* 3:395 (1991) and in U.S. Pat. No. 5,679,495 to Yamachika et al.

Photoacid generators may be incorporated into the photoresist polymer itself. In the areas exposed to the ultraviolet radiation, the polymer-bound PAG will be photochemically converted into, for example, a polymer-bound sulfonic acid group. Suitable monomers bearing PAG substituents are well known in the literature.

Additional suitable acid generators useful in conjunction with the compositions and methods provided herein will be known to those skilled in the art and/or are described in the pertinent literature.

If necessary or desirable, the positive-tone photoresist formulation may include other photoresist polymers and additives, such as dyes, sensitizers, additives used as stabilizers, dissolution modifying agents or dissolution inhibitors, and acid-diffusion controlling agents, basic compounds, photodestructible bases (PDBs), acid amplifiers (AAs), coating aids such as surfactants or anti-foaming agents, crosslinking agents, photospeed control agents, adhesion promoters and plasticizers.

Dyes that may be used to adjust the optical density of the formulated photoresist, as well as sensitizers that enhance the activity of photoacid generators by absorbing radiation and transferring it to the photoacid generator. Examples of dyes and sensitizers include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

In one embodiment, the photoresist formulation includes about 1 percent by weight to about 40 percent by weight of dissolution modifying agent or dissolution inhibitor. In another embodiment, the photoresist formulation includes about 5 percent by weight to about 30 percent by weight of dissolution modifying agent or dissolution inhibitor.

In a further embodiment, dissolution modifying agents and inhibitors have high solubility in the positive-tone photoresist formulation and in the casting solvent of the photoresist formulation. The photoresists having the dissolution modifying agents and/or dissolution inhibitors typically exhibit the following characteristics: strong dissolution inhibition, high exposed dissolution rate, and substantial transparency at the wavelength of interest. Further, these photoresists may exhibit a moderating influence on Tg, strong etch resistance, and display good thermal stability (i.e., stability at temperatures of about 140° C. or greater). Suitable dissolution inhibitors include, but are not limited to, bisphenol-A derivatives (e.g., wherein one or both hydroxyl moieties are converted to a t-butoxy substituent or a derivative thereof such as a t-butoxycarbonyl or t-butoxycarbonylmethyl group); fluorinated bisphenol-A derivatives such as $CF_3$-bisphenol A-$OCH_2$(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydropyranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al., *J. Photopolym. Sci. Technol.* 8:263 (1995)); hydroxyl-substituted analogs of such compounds (ibid.); and androstane-17-alkylcarboxylates substituted with one to three C1-C4 fluoroalkyl carbonyloxy substituents, such as t-butyl trifluoroacetyllithocholate (see, e.g., U.S. Pat. No. 5,580,694 to Allen et al.).

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines, such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Surfactants may be used to improve coating uniformity, and include a wide variety of ionic and non-ionic, monomeric, oligomeric, and polymeric species.

A wide variety of anti-foaming agents may be employed to suppress coating defects.

Adhesion promoters may be used as well; again, a wide variety of compounds may be employed to serve this function.

A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting.

Conventional photoresists designed for dry 193 nm lithography suffer from low SRCA values (~50-55° and unacceptable PAG leaching rates. Several materials approaches have been used to make photoresists compatible with immersion lithography and, specifically, to reduce PAG leaching and increase water contact angles. If the base photoresist polymer has a sufficient SRCA value, PAGs with reduced water solubility may be used in the photoresist formulation to reduce PAG leaching into the immersion fluid. Alternatively, if the photoresist does not possess sufficient a sufficient SRCA, a protective topcoat material may be applied on top of the photoresist to prevent resist component leaching and control water contact angles.

Alternatively, a surface-active oligomeric or polymeric additive may be used to control the surface properties (especially the water contact angle properties) and prevent resist component leaching into the immersion fluid during immersion lithography. A large number of topcoat-type and resist-type additives are known in the literature (see, Sanders et al., *Proc. SPIE* 6519:651904 (2007)). Loadings of the surface-active additives may range from 0.01 wt % to 20 wt % relative to the photoresist polymer and, preferably may range from 0.1 wt % to 5 wt %.

One skilled in the art will recognize the wide spectrum of commercially available products that may be used to carry out the types of functions that the additives described above perform.

In one embodiment, the sum of all additives of the positive-tone photoresist formulation will comprise less than 20 percent by weight of the solids included in the photoresist formulation. In another embodiment, the sum of all additives of the photoresist formulation will comprise less than 5 percent by weight photoresist formulation.

The remainder of the positive-tone photoresist formulation is composed of a casting solvent. The choice of casting solvent is governed by many factors not limited to the solubility and miscibility of photoresist components, the coating process, and safety and environmental regulations. Additionally, inertness to other photoresist components is desirable. In one embodiment, the casting solvent may possess the appropriate volatility to allow uniform coating of films yet also allow significant reduction or complete removal of residual solvent during the post-application bake process. See, e.g., *Introduction to Microlithography*, Eds. Thompson et al., American Chemical Society, 1994. Where the photoresist formulation is used in a multilayer imaging process, the casting solvent used in the imaging layer photoresist is preferably not a solvent to the underlying materials, otherwise the unwanted intermixing may occur. The invention is not limited to selection of any particular casting solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as propylene glycol methyl ether acetate (PGMEA), alkylene glycol monoalkyl esters such as methyl cellosolve, butyl acetate, and 2-ethoxyethanol. In one embodiment, solvents include ethyl lactate, propylene glycol methyl ether acetate, ethyl 3-ethoxypropionate and their mixtures. For resist-on-resist double patterning schemes, it is advantageous if the photoresist can be applied from an alcoholic solvent such as 4-methyl-2-pentanol, which will not dissolve or distort an underlying photoresist pattern during film formation. The above list of casting solvents is for illustrative purposes only and should not be viewed as being comprehensive nor should the choice of solvent be viewed as limiting the invention in any way. Those skilled in the art will recognize that any number of solvents or solvent mixtures may be used as casting solvents.

In one embodiment, greater than about 50 percent of the total weight of the positive-tone photoresist formulation comprises casting solvent. In another embodiment, greater than about 80 percent of the total weight of the positive-tone photoresist formulation comprises casting solvent.

In another embodiment of the present invention, there is provided a method of patterning a positive-tone photoresist comprising the steps of:
(a) applying a layer of the positive-tone photoresist of the present invention on a substrate;
(b) optionally, baking the positive-tone photoresist;
(c) patternwise exposing the positive-tone photoresist;
(d) optionally, baking the exposed positive-tone photoresist; and
(e) developing the positive-tone photoresist to selectively remove portions of the positive-tone photoresist.

The photoresist is typically applied on a substrate by spin coating; however, spray coating, dip coating, doctor blading, roll coating, and the like may also be used. The substrate may comprise a wafer or sheet of an inorganic material, including silicon and silicon dioxide, and other inorganic oxides, nitrides, and carbides. The substrate may also comprise one or more additional layers including single or multilayer bottom anti-reflective coatings (BARCs), a patterned photoresists, spin-on carbon layers, planarization layers, cap layers, seed layers, dielectric layers, metal layers, and other underlying levels of a semiconductor device.

After application of the photoresist, the substrate may be optionally baked at an elevated temperature to remove residual casting solvent and densify the photoresist film. Typical post-application bake (PAB) temperatures range from 60° C. to 150° C., more typically from 70° C. to 120° C., and even more typically from 80° C. to 100° C. Post-application bakes may last from 1 second to 10 minutes or more, although typical post-application bakes last for 30 to 90 seconds.

The film thickness of the photoresist may range from 1 nm to 5000 nm. Typical topcoat-free photoresist thicknesses used in 193 nm water immersion lithography range from 40 to 150 nm. Thinner photoresist thicknesses may be preferred for EUV or e-beam lithography and thicker layers may be preferred for 248 nm, 365 nm, or 436 nm lithography.

The photoresist may be exposed using ultraviolet radiation (e.g., i-line or g-line), deep ultraviolet radiation (e.g., wavelength <260 nm), extreme ultraviolet radiation, or electron beam radiation. Particularly useful wavelengths include 254 nm, 248 nm, 193 nm, 157 nm, and 13.5 nm. In an embodiment, the photoresist may be exposed using 193 nm immersion lithography. In a further embodiment, the photoresist may be exposed using 193 nm water immersion lithography. Water is a particularly suitable immersion fluid due to it high transparency, good refractive index, good surface tension to viscosity ratio, good thermal properties, low cost, low toxicity, and ready availability in high purity.

Alternative immersion fluids include aqueous solutions of acids, ionic species including inorganic salts and ammonium salts), water-soluble organic compounds, surfactants, micelles, and nanoparticles. Further immersion fluids include hydrocarbon liquids. Hydrocarbon immersion fluids may comprise linear, branched, cyclic, and polycyclic saturated alkanes. Amongst these, saturated polycyclic alkanes of 8 to 12 carbons have particularly advantageous combinations of high refractive index and adequate transparency at 193 nm. Examples of hydrocarbon immersion fluids include octahydroindene, 1,1-bicyclohexyl, cis-decahydronaphthalene, trans-decahydronaphthalene, cis/trans-decahydronaphthalene, and exo-tetrahydrodicyclopentadiene. Water- and hydrocarbon-based immersion fluids may also further comprise nanoparticles. Examples of suitable nanoparticle materials include hafnium oxide, lutetium aluminum garnet, magnesium oxide, alumina, silicon dioxide. The nanoparticles may also comprise ligands or surface grafted surfactants, which will stabilize the nanoparticle dispersions and prevent aggregation.

After exposure, the photoresist may optionally be subjected to a post exposure bake (PEB) to drive the chemical reaction. PEB temperatures may range from 50 to 150° C., particularly between 60 to 140° C., and more particularly between 70 to 130° C. Post-exposure bake processes may last from 1 second to 10 minutes, more preferably from 2 seconds to 2 minutes, and even more preferably from 10 seconds to 1 minute.

In one embodiment, the photoresist is developed using standard alkaline photoresist developer (usually 0.26 N aqueous tetramethylammonium hydroxide) to remove the exposed portions of the photoresist to produce a positive-tone pattern.

In another embodiment, the photoresist may be developed using an organic solvent to remove the exposed regions of the photoresist material to produce a positive-tone pattern. Suitable examples of organic solvents include ethylene glycol, propylene glycol, isopropanol, and mixtures thereof.

In a further embodiment, the positive-tone photoresist is developed using an organic solvent to remove the non-exposed photoresist material to produce a negative-tone pattern. Such a process is also referred to as negative-tone development of a positive-tone photoresist.

The resultant photoresist pattern may be used directly or further manipulated. Additional manipulations include various lithographic, surface modification, trim, and deposition processes, especially those required for double patterning lithographic processes. The photoresist pattern may be used to protect the substrate during ion implantation. In particular, the photoresist pattern may ultimately be transferred to the underlying substrate. Pattern transfer may be accomplished by either dry or wet etch processes. In particular, a reactive ion etch (RIE) using oxygen or a fluorine-containing gas may be used to transfer the pattern depending upon the chemistry of the substrate. If the substrate comprises a bottom anti-reflective coating (BARC) layer, a breakthrough etch process may be required prior to transfer of the pattern into the underlying substrate. If a photoimageable or developable BARC is used, such a process may not be required. If the pattern is transferred into a dielectric material such as an oxide layer, the resulting features may be lined and then filled with a conductive metal such as aluminum, copper, or tungsten to form metal wires, interconnects, and contacts.

The following discussion will address photoresist compositions wherein a topcoat is applied to the photoresist. It is to be understood that within the context of the present invention, the application of a topcoat to the photoresist is an alternative embodiment, which is not intended to be limiting to the scope of the topcoat-free photoresists described herein.

In a further embodiment of the present invention, there is provided a method of patterning a positive-tone photoresist comprising the steps of:

(a) applying a layer of the positive-tone photoresist of the present invention on a substrate;
(b) optionally, baking the positive-tone photoresist;
(c) applying a layer of topcoat material to form a topcoat on the positive-tone photoresist;
(d) optionally, baking the topcoat;
(e) patternwise exposing the positive-tone photoresist;
(f) optionally, baking the exposed positive-tone photoresist; and
(g) developing the positive-tone photoresist to selectively remove the topcoat material and portions of the positive-tone photoresist.

A large number of suitable topcoats are known in the literature. Early topcoats such as TSP-3A from Tokyo Ohka Kogyo (Tokyo, Japan) were based on hydrophobic fluoropolymers. Although these material possess very large receding contact angles (>100°) with water and enable good lithographic performance, these fluoropolymer topcoats are not soluble in standard aqueous tetramethylammonium hydroxide photoresist developer and, therefore, require an extra topcoat removal step using a fluorinated solvent prior to resist development. These extra process steps and materials increase the cost-of-ownership of this type of topcoat. For these and other reasons, these topcoats are no longer commercially available. Instead, alkali-soluble topcoats are preferred because they can be removed during the photoresist development step.

If necessary or desirable, the topcoat formulation may include, besides the casting solvent and the topcoat polymer, other polymers and/or additives, such as dyes, sensitizers, additives used as stabilizers, photoacid generators, dissolution modifying agents or dissolution inhibitors, and acid-diffusion controlling agents, basic compounds, photodestructible bases (PDBs), acid amplifiers (AAs), coating aids such as surfactants or anti-foaming agents, crosslinking agents, photospeed control agents, adhesion promoters and plasticizers.

The topcoat polymer can further comprise comonomers in order to tune various properties of the topcoat. For example, hydrophobic comonomers may be incorporated to increase water contact angle values. Suitable hydrophobic comonomers include methacrylate, α-(trifluoromethyl)acrylate, α-(fluoro)acrylate, and acrylate monomers bearing alkyl, fluoroalkyl, and perfluoroalkyl substituents. A few examples include: 1,1,1,3,3,3-hexafluoroprop-2-yl methacrylate, 2,2,2-trifluoroethyl methacrylate, 4,4,4,3,3,2,2-heptafluorobutyl methacrylate. Alternative comonomers include cyclic olefin (e.g., norbornene-based) monomers which may comprise hydrophobic groups such as alkyl, fluoroalkyl, and perfluoroalkyl substituents.

Comonomers comprising base-soluble groups may also be incorporated to further boost dissolution rates in alkaline developing solutions. Suitable base-soluble groups include carboxylic acid and fluoroalcohol (especially hexafluoroalcohol) groups. Representative carboxylic acid-containing monomers include acrylic acid, methacrylic acid, α-(trifluoromethyl)acrylic acid, α-(fluoro)acrylic acid, maleic acid, fumaric acid, norborn-5-ene-2-carboxylic acid, norborn-5-ene-2-methyl-2-carboxylic acid, norborn-5-ene-2-fluoro-2-carboxylic acid, norborn-5-ene-2-trifluoromethyl-2-carboxylic acid and the like.

Representative hexafluoroalcohol-containing monomers include 5/6-(3,3,3-trifluoro-2-hydroxy-2-(trifluoromethyl)propyl)bicyclo[2.2.1]heptan-2-yl methacrylate (NB-HFAMA), 1-cyclohexyl-4,4,4-trifluoro-3-hydroxy-3-(trifluoromethyl)butan-1-yl methacrylate (MA-ACH-HFA), and 3,5-bis(1,1,1,3,3,3-hexafluoropropan-2-ol-2-yl)cyclohexyl methacrylate, and 1,1,1-trifluoro-2-trifluoromethyl-2-hydroxy-pent-4-ene, 2-(1,1,1-trifluoro-2-trifluoromethyl-2-hydroxy-prop-3-yl)norborn-5-ene (NBHFA), and 1,1,1-trifluoro-2-trifluoromethyl-2-hydroxy-pentan-4-yl methacrylate (MA-BTHB-OH). Other suitable hexafluoroalcohol-containing monomers are reported in H. Ito, "Chemical Amplification Resists for Microlithography," *Adv. Polym. Sci.*, 172:37 (2005) and Sanders et al., *Proc. SPIE* 6519: 651904 (2007).

Alternatively, base-reactive groups such as lactones and carboxylic acid anhydrides may be used instead. Representative monomers bearing carboxylic acid anhydrides include maleic anhydride, norborn-5-ene-2,3-carboxylic acid anhydride. Representative monomers bearing lactone groups include α-methylene-γ-butyrolactone, γ-methylene-γ-butyrolactone, 2-oxo-tetrahydrofuran-3-yl acrylate, 2-oxo-tetrahydrofuran-3-yl methacrylate, 5-oxo-tetrahydrofuran-3-yl acrylate, 5-oxo-tetrahydrofuran-3-yl methacrylate, hexahydro-2-oxo-3,5-methano-2H-cyclopenta[b]furan-6-yl methacrylate (NLM) and the like.

Comonomers bearing strongly acidic groups may be incorporated to tune the topcoat interaction with the photoresist and control the profiles of the imaged photoresist structures. In particular, monomers bearing sulfonic acid groups have been demonstrated to be suitable for this purpose. Representative monomers bearing sulfonic acid groups include vinyl sulfonic acid, allyl sulfonic acid, 2-sulfoethyl methacrylate, 2-sulfoethyl acrylate, 3-sulfopropyl methacrylate, 3-sulfopropyl acrylate, 2-acrylamido-2-methyl-1-propanesulfonic acid, 2-methacrylamido-2-methyl-1-propanesulfonic acid, and 4-vinyl-benzenesulfonic acid.

Monomers bearing photoacid generators may be incorporated into the topcoat in lieu of monomers bearing strongly acidic groups. In the areas exposed to the ultraviolet radiation, the polymer-bound PAG will be photochemically converted into, for example, a polymer-bound sulfonic acid. A large number of suitable monomers bearing PAG substituents are known in the literature.

The topcoat solvent may comprise one solvent or two or more different volatile solvents. Preferred solvents that do not dissolve the underlying resist include low aliphatic alcohols, aliphatic or aromatic ethers, perfluoroalkyl ethers, fluoroalkyl ethers, saturated hydrocarbons, hydrofluorocarbons, perfluorocarbons, and mixtures thereof. Example casting solvents include 2-butanol, 4-methyl-2-pentanol, di-n-butyl ether, and mixtures of 2-octanol and n-decane. Many other examples of suitable solvents are known in the art. Casting solvents are not included in total solids calculations. Further, stabilizers, surfactants and other additives (if any) may be added to the casting solution. In one example, surfactants comprise less than about 1 percent by weight of the totals solids content of the casting solution. In one example, stabilizers and other additives together comprise less than about 10 percent by weight of the total solids content of the casting solution. Surfactants, stabilizers and other additives may be added to the basic casting solution as solids or as solutions of dissolved solids to form the completed casting solution.

The topcoat is typically applied on top of a photoresist by spin coating; however, spray coating, dip coating, doctor blading, roll coating, and the like may also be used. The film thickness of the underlying photoresist may range from 1 nm to 5000 nm. Typical photoresist thicknesses used in 193 nm water immersion lithography range from 40 to 150 nm. Thinner photoresist thicknesses may be required for EUV or e-beam lithography and thicker layers may be required for 248 nm, 365 nm, or 436 nm lithography.

After application of the topcoat, the substrate may be optionally baked at an elevated temperature to remove residual casting solvent and densify the topcoat film. Typically, the post-application bake temperature is lower than the glass transition temperature of the underlying photoresist film to minimize interdiffusion of the two material layers. Typical post-application bake temperatures range from 60° C. to 150° C., more typically from 70° C. to 120° C., and even more typically from 80° C. to 100° C. Post-application bakes may last from 1 second to 10 minutes or more, although typical post-application bakes last for 30 to 90 seconds.

The film thickness of the topcoat may range from 1 nm to 5000 nm. Typical topcoat thicknesses used in 193 nm water immersion lithography range from 30 to 120 nm. The film thickness of the topcoat can be adjusted to provide for good anti-reflective properties and good leaching resistance. Top anti-reflective coating (TARC) materials have been used in dry lithography to minimize reflectivity and maximize lithographic performance. The ideal refractive index of a non-absorbing TARC is given by $$n_{TARC} = \sqrt{n_{immersionfluid} n_{resist}}$$

wherein $n_{TARC}$, $n_{immersionfluid}$, and $n_{resist}$ are the refractive indices of the TARC, immersion fluid and photoresist, respectively. Furthermore, the ideal thickness (T) corresponds to a quarter wavelength $$T_{TARC} = \frac{\lambda_0}{4 n_{TARC}}$$

wherein $\lambda_0$ is the vacuum wavelength of the radiation. More general methods to calculate the ideal optical properties and thicknesses of absorbing TARC materials are known in the literature.

The photoresist may be exposed using ultraviolet radiation (e.g., i-line or g-line), deep ultraviolet radiation (e.g., wavelength <260 nm), extreme ultraviolet radiation, or electron beam radiation. Particularly useful wavelengths include 436 nm, 365 nm, 254 nm, 248 nm, 193 nm, 157 nm, and 13.5 nm. In an embodiment, the photoresist may be exposed using 193 nm immersion lithography. In a further embodiment, the photoresist may be exposed using 193 nm water immersion lithography. Water is a particularly suitable immersion fluid due to it high transparency, good refractive index, good surface tension to viscosity ratio, good thermal properties, low cost, low toxicity, and ready availability in high purity. Other acceptable immersion fluids have been discussed above.

After exposure, the photoresist may optionally be subjected to a post exposure bake (PEB) to drive the chemical reaction. PEB temperatures may range from 50 to 150° C., particularly between 60 to 140° C., and more particularly between 70 to 130° C. Post-exposure bake processes may last from 1 second to 10 minutes, more preferably from 2 seconds to 2 minutes, and even more preferably from 10 seconds to 1 minute.

The topcoat may be removed prior to or during the development of the underlying positive-tone photoresist. In one embodiment, the topcoat is removed during the photoresist development process using standard alkaline photoresist developer (usually 0.26 N aqueous tetramethylammonium hydroxide). Alternatively, the topcoat may be removed with an organic solvent prior to development of the underlying photoresist. Suitable solvents for this propose include topcoat casting solvents listed previously. Furthermore, the topcoat may be removed during development of the underlying positive-tone photoresist using an organic solvent. In such a process, the topcoat and the exposed regions of the positive-tone photoresist can be removed in one step using organic solvents such as ethylene glycol, propylene glycol, isopropanol, and mixtures thereof to form a positive-tone pattern. Alternatively, the topcoat and the unexposed regions of the positive-tone photoresist can be removed in one step using organic solvents such as anisole to form a negative-tone pattern.

The resultant photoresist pattern may be used directly or further manipulated. Additional manipulations include various lithographic, surface modification, trim, and deposition processes, especially those required for double patterning lithographic processes. The photoresist pattern may be used to protect the substrate during ion implantation. In particular, the photoresist pattern may ultimately be transferred to the underlying substrate. Pattern transfer may be accomplished by either dry or wet etch processes. In particular, a reactive ion etch (RIE) using oxygen or a fluorine-containing gas may be used to transfer the pattern depending upon the chemistry of the substrate. If the substrate comprises a bottom anti-reflective coating (BARC) layer, a breakthrough etch process may be required prior to transfer of the pattern into the underlying substrate. If a photoimageable or developable BARC is used, such a process may not be required. If the pattern is transferred into a dielectric material such as an oxide layer, the resulting features may be lined and then filled with a conductive metal such as aluminum, copper, or tungsten to form metal wires, interconnects, and contacts.

EXPERIMENTAL

Unless indicated otherwise, parts are parts by weight, temperature is in ° C. and pressure is at or near atmospheric. 5/6-((trifluoromethylsulfonamido)methyl)bicyclo[2.2.1] heptan-2-yl methacrylate (AMNB-Tf-MA) and 2-(trifluoromethylsulfonamido)ethyl methacrylate (EATf-MA) were obtained from Central Glass (Japan). 2,2'-Azobis(2-methylpropionitrile) (AIBN) was obtained from Aldrich Chemical Co. Additionally, all the other starting materials were obtained commercially or were synthesized using known procedures.

Where appropriate, the following techniques and equipment were utilized in the examples: $^1$H, $^{13}$C and $^{19}$F NMR spectra were obtained at room temperature on an Avance 400 spectrometer. Quantitative inverse-gated $^{13}$C NMR spectra were obtained using Cr(acac)$_3$ as a relaxation agent in acetone-d$_6$. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 5° C./min on a TA Instruments DSC 2920 modulated differential scanning calorimeter. The sample was ramped to 130° C., cooled to room temperature, and then ramped to 250° C. Glass transition temperatures were determined using data from the second heating run. Molecular weights were measured using size-exclusion chromatography with a Waters Model 150 chromatograph relative to polystyrene standards using tetrahydrofuran (THF) as an eluent. IR spectra were recorded on a Nicolet 510 FT-IR spectrometer on a film cast on a KBr plate. Film thickness was measured on a Tencor alpha-step 2000 or Nanospec. A quartz crystal microbalance (QCM) with a MAXTEC Inc. PLO-10 Phase lock oscillator was used to study the dissolution kinetics of the resist films in an aqueous 0.26N tetramethylammonium hydroxide (TMAH) solution (FujiFILM Optiyield CD). Lithographic evaluation was performed on a 193 nm dry exposure tool (ISI, 0.6NA, COG mask) or a 193 nm interferometric exposure tool.

Examples 2-4 below describe the synthesis of photoresists (R1-R3) from known sulfonamide-containing methacrylate monomers and Examples 5-11 describe the synthesis of the sulfonamide-containing photoresist compositions (R4-R10) of the present invention. Examples 12-17 present the comparative lithographic imaging performance of the photoresists R1-R10. Example 18 demonstrates the ability to dissolve selected photoresists in and spin cast useful films from an alcoholic solvent.

EXAMPLE 1

Synthetic Polymerization

A representative free-radical polymerization procedure used to prepare the polymers herein is as follows: to a 100 mL round-bottom flask, monomer (1 eq.) and 2,2'-azobis(2-methylpropionitrile) (AIBN) (0.04 eq.) was added. Methyl ethyl ketone (OMNISOLV®, reagent grade, EM Industries, Hawthorne, N.Y., USA) was added to afford about 25 percent by weight solids solution. A reflux condenser with a rubber septum was added and the oxygen was removed from the solution by three sequential pump-backfill cycles using nitrogen while stirring vigorously. The flask was placed under positive nitrogen pressure prior to heating the reaction at reflux overnight. After the reaction was complete, the reaction mixture was cooled to room temperature and the polymer solution was precipitated into a non-solvent (typically, hexane or methanol). The precipitated polymer was collected on a ceramic frit Buchner funnel (medium porosity). The polymer was reprecipitated from methyl ethyl ketone into the non-solvent as many times as necessary to remove residual monomer and other polymerization by-products (typically, 2-3 total precipitations). The final polymer was isolated on a ceramic frit Buchner funnel (medium porosity) and washed with excess non-solvent. The polymer was dried under vacuum overnight between 70° C. to 90° C., after which time, it was allowed to cool to room temperature under vacuum.

EXAMPLE 2

Synthesis of Poly(EATf-MA/MADMA/NLM) (15:45:40) (R1)

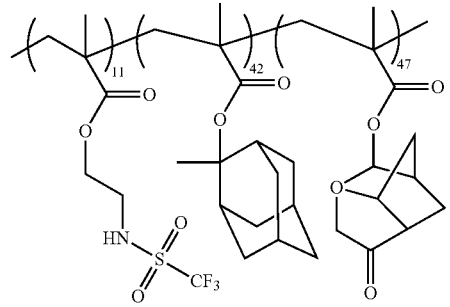

To a 100 mL roundbottom flask, 2-(trifluoromethylsulfonamido)ethyl methacrylate (EATf-MA) (1.11 g, 4.3 mmol, 0.15 eq.), 2-methyladamant-2-yl methacrylate (MADMA) (3.0 g, 12.8 mmol, 0.45 eq.), hexahydro-2-oxo-3,5-methano-2H-cyclopenta[b]furan-6-yl methacrylate (also described as 2-oxo-3-oxatricyclo[4.2.1.0$^{4,8}$]nonan-5-yl methacrylate, NLM) (2.53 g, 11.4 mmol, 0.40 eq.), 1-dodecanethiol (115 mg, 0.57 mmol, 0.02 eq.), 2,2'-azobis(2-methylpropionitrile) (AIBN) (187 mg, 0.04 eq.), and methyl ethyl ketone (20 mL) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion the reaction flask was cooled to room temperature and the polymer precipitated into a 30-fold excess of hexane. The polymer was isolated using a medium porosity ceramic fitted Buchner funnel. The white polymer was redissolved into a minimal amount of methyl ethyl ketone and the precipitation process repeated two times. Upon final isolation on the Buchner funnel, the polymer was washed 1 time with hexane. The polymer was dried in vacuo at 80° C. overnight. The polymer was allowed to cool to room temperature under vacuum prior to determining the yield. The final composition was 11:42:47 as determined by inverse-gated $^{13}$C NMR using Cr(acac)$_3$ as a relaxation agent in acetone-d6. Yield: 5.2 g (68%). M$_n$: 4040 g/mol. PDI: 1.72. T$_g$: 172° C.

EXAMPLE 3

Synthesis of Poly(EATf-MA/ECPMA) (40:60) (R2)

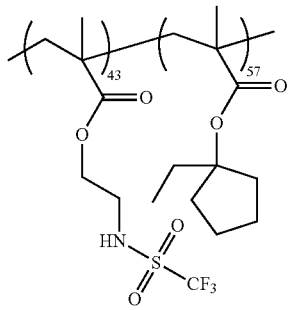

To a 100 mL roundbottom flask, 2-(trifluoromethylsulfonamido)ethyl methacrylate (EATf-MA) (2.0 g, 7.7 mmol, 0.4 eq.), 1-ethylcyclopentyl methacrylate (ECPMA) (2.1 g, 11.5 mmol, 0.6 eq.), 2,2'-azobis(2-methylpropionitrile) (AIBN) (126 mg, 0.04 eq.), and methyl ethyl ketone (10 g) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion the reaction flask was cooled to room temperature and the polymer precipitated into a 30-fold excess of hexane. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexane. The polymer was dried in vacuo at 80° C. overnight. The polymer was allowed to cool to room temperature under vacuum prior to determining the yield. The final composition was 43:57 as determined by inverse-gated $^{13}$C NMR using Cr(acac)$_3$ as a relaxation agent in acetone-d6. Yield: 2.7 g (66%). $M_n$: 6410 g/mol. PDI: 1.35. $T_g$: 98° C.

EXAMPLE 4

Synthesis of Poly(AMNB-Tf-MA/ECPMA) (40:60) (R3)

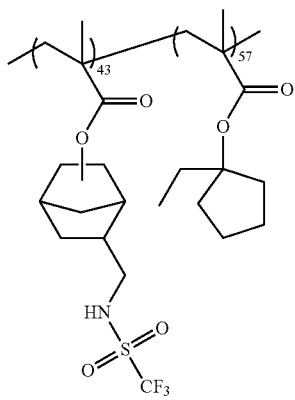

To a 100 mL roundbottom flask, 5/6-((trifluoromethylsulfonamido)methyl) bicyclo[2.2.1]heptan-2-yl methacrylate (AMNB-Tf-MA) (2.0 g, 5.9 mmol, 0.4 eq.), 1-ethylcyclopentyl methacrylate (ECPMA) (1.6 g, 8.8 mmol, 0.6 eq.), 2,2'-azobis(2-methylpropionitrile) (AIBN) (96 mg, 0.04 eq.), and methyl ethyl ketone (10 g) were added. A reflux condenser was added with a rubber septum was added and the oxygen was removed from the solution by three sequential pump-backfill cycles using nitrogen while stirring vigorously. The reaction flask was placed under nitrogen and transferred to an oil bath to reflux overnight. Upon completion the reaction flask was cooled to room temperature and the polymer precipitated into a 30-fold excess of hexane. The polymer was isolated using a medium porosity ceramic fitted Buchner funnel. The white polymer was redissolved into a minimal amount of methyl ethyl ketone and the precipitation process repeated one time. Upon final isolation on the Buchner funnel, the polymer was washed 1 time with hexane. The polymer was dried in vacuo at 80° C. overnight. The polymer was allowed to cool to room temperature under vacuum prior to determining the yield. The final composition was 43:57 as determined by inverse-gated $^{13}$C NMR using Cr(acac)$_3$ as a relaxation agent in acetone-d6. Yield: 2.8 g (77%). $M_n$: 8900 g/mol. PDI: 1.80. $T_g$: 106° C.

EXAMPLE 5

Synthesis of Poly(1-Me-EATf-MA/MADMA/NLM) (15:45:40) (R4)

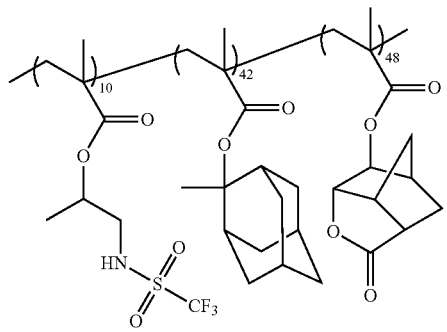

To a 100 mL roundbottom flask, 1-(trifluoromethylsulfonamido)propan-2-yl methacrylate (1-Me-EATf-MA) (0.59 g, 2.13 mmol, 0.15 eq.), 2-methyladamant-2-yl methacrylate (MADMA) (1.5 g, 6.4 mmol, 0.45 eq.), hexahydro-2-oxo-3,5-methano-2H-cyclopenta[b]furan-6-yl methacrylate (NLM) (1.26 g, 5.7 mmol, 0.40 eq.), 1-dodecanethiol (58 mg, 0.29 mmol, 0.02 eq.), 2,2'-azobis(2-methylpropionitrile) (AIBN) (93 mg, 0.04 eq.), and methyl ethyl ketone (10 g) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion the reaction flask was cooled to room temperature and the polymer precipitated into a 30-fold excess of methanol. The polymer was isolated using a medium porosity ceramic fritted Buchner funnel. The white polymer was redissolved into a minimal amount of methyl ethyl ketone and the precipitation process repeated twice. Upon final isolation on the Buchner funnel, the polymer was washed 1 time with methanol. The polymer was dried in vacuo at 80° C. overnight. The polymer was allowed to cool to room temperature under vacuum prior to determining the yield. The final composition was 10:42:48 as determined by inverse-gated $^{13}$C NMR using Cr(acac)$_3$ as a relaxation agent in acetone-d6. Yield: 1.9 g (56%). $M_n$: 3380 g/mol. PDI: 1.72. $T_g$: none detected.

EXAMPLE 6

Synthesis of Poly(2-Me-EATf-MA/MADMA/NLM) (15:45:40) (R5)

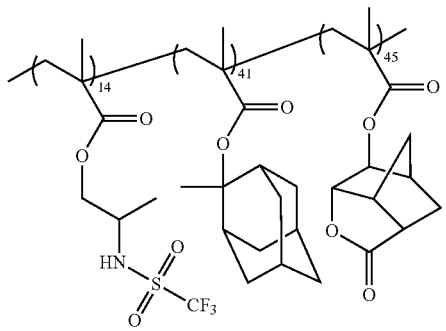

To a 100 mL roundbottom flask, 2-(trifluoromethylsulfonamido)propyl methacrylate (2-Me-EATf-MA) (0.59 g, 2.13 mmol, 0.15 eq.), 2-methyladamant-2-yl methacrylate (MADMA) (1.5 g, 6.4 mmol, 0.45 eq.), hexahydro-2-oxo-3,5-methano-2H-cyclopenta[b]furan-6-yl methacrylate (NLM) (1.26 g, 5.7 mmol, 0.40 eq.), 1-dodecanethiol (26 mg, 0.13 mmol, 0.01 eq.), 2,2'-azobis(2-methylpropionitrile) (AIBN) (93 mg, 0.04 eq.), and methyl ethyl ketone (10 g) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion, the reaction flask was cooled to room temperature and the polymer precipitated into a 30-fold excess of methanol. The polymer was isolated using a medium porosity ceramic fritted Buchner funnel. The white polymer was redissolved into a minimal amount of methyl ethyl ketone and the precipitation process repeated twice. Upon final isolation on the Buchner funnel, the polymer was washed 1 time with methanol. The polymer was dried in vacuo at 80° C. overnight. The polymer was allowed to cool to room temperature under vacuum prior to determining the yield. The final composition was 14:41:45 as determined by inverse-gated $^{13}$C NMR using Cr(acac)$_3$ as a relaxation agent in acetone-d6. Yield: 2.4 g (70%). $M_n$: 4603 g/mol. PDI: 1.72. $T_g$: 176° C.

EXAMPLE 7

Synthesis of Poly(1-Me-EATf-MA/ECPMA) (40:60) (R6)

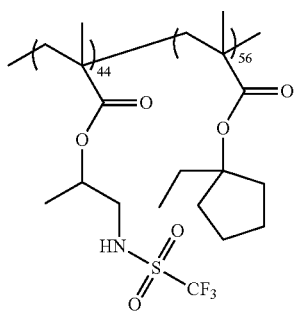

To a 100 mL roundbottom flask, 1-(trifluoromethylsulfonamido)propan-2-yl methacrylate (1-Me-EATf-MA) (2.0 g, 7.3 mmol, 0.40 eq.), 1-ethylcyclopentyl methacrylate (ECPMA) (1.99 g, 10.9 mmol, 0.6 eq.), 2,2'-azobis(2-methylpropionitrile) (AIBN) (119 mg, 0.04 eq.), and methyl ethyl ketone (10 g) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion, the reaction flask was cooled to room temperature and the polymer precipitated into a 30-fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. The final composition was 44:56 as determined by inverse-gated $^{13}$C NMR using Cr(acac)$_3$ as a relaxation agent in acetone-d6. Yield: 2.5 g (62%). $M_n$: 8220 g/mol. PDI: 1.48. $T_g$: 112° C.

EXAMPLE 8

Synthesis of Poly(2-Me-EATf-MA/ECPMA) (40:60) (R7)

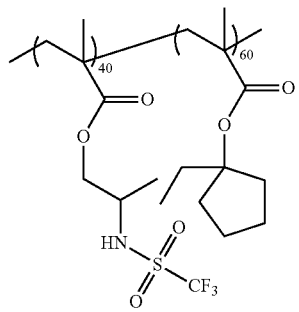

To a 100 mL roundbottom flask, 2-(trifluoromethylsulfonamido)propyl methacrylate (2-Me-EATf-MA) (2.0 g, 7.3 mmol, 0.40 eq.), 1-ethylcyclopentyl methacrylate (ECPMA) (1.99 g, 10.9 mmol, 0.6 eq.), 2,2'-azobis(2-methylpropionitrile) (AIBN) (119 mg, 0.04 eq.), and methyl ethyl ketone (10 g) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion, the reaction flask was cooled to room temperature and the polymer precipitated into a 30-fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. The final composition was 40:60 as determined by inverse-gated $^{13}$C NMR using Cr(acac)$_3$ as a relaxation agent in acetone-d6. Yield: 2.4 g (60%). $M_n$: 8260 g/mol. PDI: 1.47. $T_g$: 108° C.

EXAMPLE 9

Synthesis of Poly(2,2-diMe-EATf-MA/MADMA) (33:66) (R8)

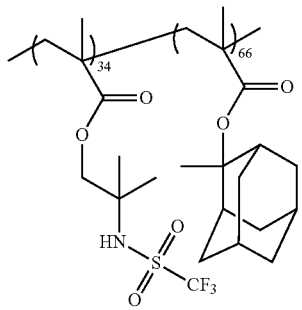

To a 100 mL roundbottom flask, 2-methyl-2-(trifluoromethylsulfonamido)propyl methacrylate (2,2-diMe-EATf-MA) (1.0 g, 3.5 mmol, 0.33 eq.), 2-methyladamant-2-yl methacrylate (MADMA) (1.6 g, 6.9 mmol, 0.66 eq.), 2,2'-azobis(2-methylpropionitrile) (AIBN) (68.8 mg, 0.04 eq.), and methyl ethyl ketone (7.9 g) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion, the reaction flask was cooled to room temperature and the polymer precipitated into a 30-fold excess of methanol. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with methanol. The polymer was dried in vacuo at 80° C. overnight. The polymer was allowed to cool to room temperature under vacuum prior to determining the yield. The final composition was 34:66 as determined by inverse-gated $^{13}$C NMR using Cr(acac)$_3$ as a relaxation agent in acetone-d6. Yield: 0.81 g (31%). M$_n$: 7220 g/mol. PDI: 1.51. T$_g$: 165° C.

EXAMPLE 10

Synthesis of Poly(2,2-diMe-EATf-MA/ECPMA/NLM) (15:45:40) (R9)

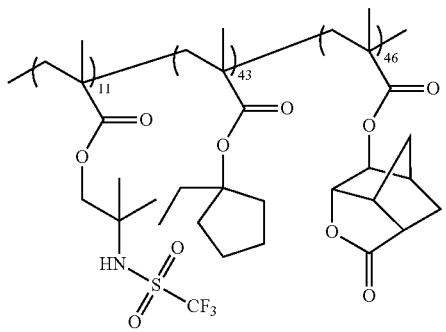

To a 100 mL roundbottom flask, 2-methyl-2-(trifluoromethylsulfonamido)propyl methacrylate (2,2-diMe-EATf-MA) (1.0 g, 3.5 mmol, 0.15 eq.), 1-ethylcyclopentyl methacrylate (ECPMA) (1.9 g, 10.4 mmol, 0.45 eq.), hexahydro-2-oxo-3,5-methano-2H-cyclopenta[b]furan-6-yl methacrylate (NLM) (2.05 g, 9.2 mmol, 0.40 eq.), 2,2'-azobis(2-methylpropionitrile) (AIBN) (151 mg, 0.04 eq.), and methyl ethyl ketone (10 mL) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion, the reaction flask was cooled to room temperature and the polymer precipitated into a 30-fold excess of methanol. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with methanol. The polymer was dried in vacuo at 80° C. overnight. The polymer was allowed to cool to room temperature under vacuum prior to determining the yield. The final composition was 11:43:46 as determined by inverse-gated $^{13}$C NMR using Cr(acac)$_3$ as a relaxation agent in acetone-d6. Yield: 3.1 g (63%). M$_n$: 8050 g/mol. PDI: 1.87. T$_g$: 156° C.

EXAMPLE 11

Synthesis of Poly(2,2-diMe-EATf-MA/ECPMA/HADMA) (15:45:40) (R10)

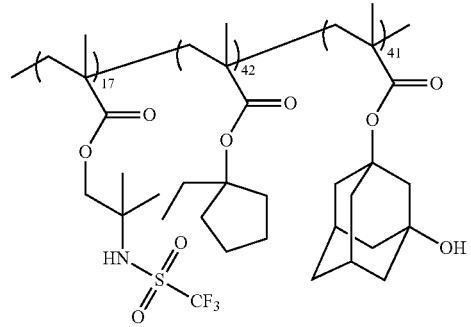

To a 100 mL roundbottom flask, 2-methyl-2-(trifluoromethylsulfonamido)propyl methacrylate (2,2-diMe-EATf-MA) (1.0 g, 3.5 mmol, 0.15 eq.), 1-ethylcyclopentyl methacrylate (ECPMA) (1.9 g, 10.4 mmol, 0.45 eq.), 3-hydroxyadamantyl methacrylate (HADMA) (2.18 g, 9.2 mmol, 0.40 eq.), 2,2'-azobis(2-methylpropionitrile) (AIBN) (151 mg, 0.04 eq.), and methyl ethyl ketone (10 mL) were added. A reflux condenser with a rubber septum was added and the oxygen was removed from the solution by three sequential pump-backfill cycles using nitrogen while stirring vigorously. The reaction flask was placed under nitrogen and transferred to an oil bath to reflux overnight. Upon completion, the reaction flask was cooled to room temperature and the polymer precipitated into a 30-fold excess of methanol. The polymer was isolated using a medium porosity ceramic fitted Buchner funnel. The white polymer was redissolved into a minimal amount of methyl ethyl ketone and the precipitation process repeated one time. Upon final isolation on the Buchner funnel, the polymer was washed 1 time with methanol. The polymer was dried in vacuo at 80° C. overnight. The polymer was allowed to cool to room temperature under vacuum prior to determining the yield. The final composition was 17:42:41 as determined by inverse-gated $^{13}$C NMR using Cr(acac)$_3$ as a relaxation agent in acetone-d6. Yield: 4.3 g (84%). M$_n$: 6750 g/mol. PDI: 2.43. T$_g$: >T$_{decomp}$.

TABLE 1

Properties of photoresists.

| Entry | Photoresist | Feed Ratio | Polymer Ratio | $M_n$ [g/mol] | PDI | $T_g$ [°C.] |
|---|---|---|---|---|---|---|
| | | Known Materials | | | | |
| R1 | Poly(EATf-MA/MADMA/NLM) | 15:45:40 | 11:42:47 | 4040 | 1.72 | 172 |
| R2 | Poly(EATf-MA/ECPMA) | 40:60 | 43:57 | 6414 | 1.35 | 98 |
| R3 | Poly(AMNB-Tf-MA/ECPMA) | 40:60 | 43:57 | 8900 | 1.80 | 106 |
| | | Inventive Materials | | | | |
| R4 | Poly(1-Me-EATf-MA/MADMA/NLM) | 15:45:40 | 10:42:48 | 3380 | 1.72 | ND |
| R5 | Poly(2-Me-EATf-MA/MADMA/NLM) | 15:45:40 | 14:41:45 | 4600 | 1.73 | 176 |
| R6 | Poly(1-Me-EATf-MA/ECPMA) | 40:60 | 44:56 | 8220 | 1.48 | 112 |
| R7 | Poly(2-Me-EATf-MA/ECPMA) | 40:60 | 40:60 | 8260 | 1.47 | 108 |
| R8 | Poly(2,2-diMe-EATf-MA/MADMA) | 33:66 | 34:66 | 7200 | 1.51 | 165 |
| R9 | Poly(2,2-diMe-EATf-MA/ECPMA/NLM) | 15:45:40 | 11:43:46 | 8050 | 1.87 | 156 |
| R10 | Poly(2,2-diMe-EATf-MA/ECPMA/HADMA) | 15:45:40 | 17:42:41 | 6750 | 2.43 | ND |

EXAMPLE 12

Formulation of Resists Containing MADMA-Based Resists (R1, R4 & R5)

Photoresist base resin (0.125 g), triphenylsulfonium nonaflate (126 mg of 20 wt % solution in PGMEA), N-phenyl benzimidazole (432 mg of 0.5 wt % solution in PGMEA), and 9.5 g of solvent (PGMEA/gamma-butyrolactone, 7:3 by weight) were stirred and filtered through a 0.2 μm PTFE filter. PAG loading: 5 wt % relative to photoresist base resin. Quencher loading: 25 mol % relative to PAG. Total photoresist solution solids content: ~5 wt %.

EXAMPLE 13

Imaging of Resists Containing MADMA-Based Resists (R1, R4 & R5)

The photoresists were spun at 3000 rpm for 30 seconds onto 5 inch silicon wafers coated with 780 angstroms of ARC-29A (Brewer Science). A post-apply bake was performed at 125° C. for 60 seconds. Line-space patterns were imaged using an Ultratech 193 nm mini-stepper (0.6NA, chrome-on-glass mask). The exposed wafers were baked at 140° C. for 60 seconds and subsequently developed for 60 seconds with 0.26N TMAH developer (Optiyield CD, FujiF-ILM). The wafers were rinsed with deionized water and spun dry.

The imaging results with photoresists based on 2-methyladamantyl methacrylate (R1, R4, and R5) are shown in FIG. 3. All photoresists show comparable imaging performance. The impact of the particular sulfonamide-based monomer is masked by the high glass transition temperatures imparted by the high proportion of MADMA and NLM in these materials. The influence of the sulfonamide-based monomer on the glass transition temperature of the photoresist and, consequently, the imaging performance is more evident in photoresists with lower Tg comonomers (e.g., ECPMA) and higher relative content of the sulfonamide-based monomer (such as photoresists R2, R3, R6 & R7).

EXAMPLE 14

Formulation of Resists Containing ECPMA (R2, R3, R6 & R7)

Photoresist base resin (0.200 g), triphenylsulfonium nonaflate (50 mg of 20 wt % solution in PGMEA), N-phenyl benzimidazole (173 mg of 0.5 wt % solution in PGMEA), and 1.8 g of solvent (PGMEA) were stirred and filtered through a 0.2 μm PTFE filter. PAG loading: 5 wt % relative to photoresist base resin. Quencher loading: 25 mol % relative to PAG. Total photoresist solution solids content: ~9 wt %.

EXAMPLE 15

Imaging Resists Containing ECPMA (R2, R3, R6 & R7)

The photoresists were spun at 2000 rpm for 30 seconds onto 5 inch silicon wafers coated with 780 angstroms of ARC-29A (Brewer Science). A post-apply bake was performed at 110° C. for 60 seconds. Line-space patterns were imaged using a Ultratech 193 nm mini-stepper (0.6NA, chrome-on-glass mask). The exposed wafers were baked at 120° C. for 60 seconds and subsequently developed for 60 seconds with 0.26N TMAH developer (Optiyield CD, FujiF-ILM). The wafers were rinsed with deionized water and spun dry.

Figure 4:
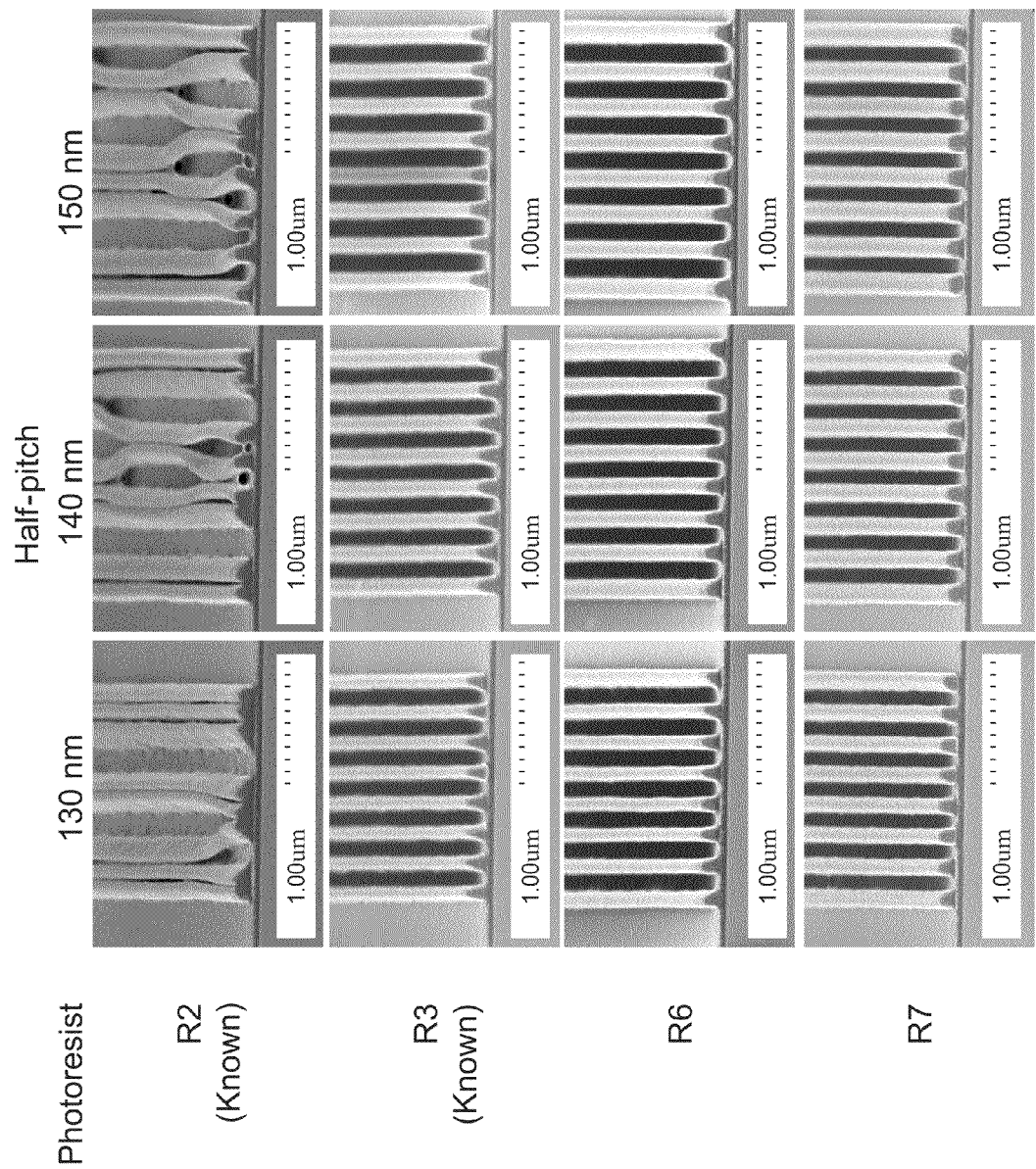
FIG. 4 is a collection of scanning electron micrographs showing imaging of photoresists of the present invention based on 1-ethylcyclopentyl methacrylate.

The imaging results with photoresists based on 1-ethylcyclopentyl methacrylate (ECPMA) (R2, R3, R6 & R7) are shown in FIG. 4. The photoresist R2 based on a methacrylate monomer having a sulfonamide group and a linear linking group exhibits poor imaging behavior with extensive line collapse. In contrast, photoresists R6 and R7 based on methacrylate monomers having a sulfonamide group and a branched linking group such as 1-Me-EATf-MA and 2-Me-EATf-MA show equivalent imaging performance to that of the photoresist R3 based on a methacrylate monomer having a sulfonamide group and a cyclic linking group (AMNB-Tf-MA).

EXAMPLE 16

Formulation of resists containing 2,2-diMe-EATf-MA (R9-R10)

Photoresist base resin (0.200 g), triphenylsulfonium nonaflate (60 mg of 20 wt % solution in PGMEA), N-phenyl benzimidazole (206 mg of 0.5 wt % solution in PGMEA), and 2.58 g of solvent (PGMEA/cyclohexanone, 7:3 by weight) were stirred and filtered through a 0.2 μm PTFE filter. PAG loading: 6 wt % relative to photoresist base resin. Quencher loading: 25 mol % relative to PAG. Total photoresist solution solids content: ~7 wt %.

EXAMPLE 17

Imaging of Resists Containing 2,2-diMe-EATf-MA (R9-R10)

The photoresists were spun at 3400 rpm for 30 seconds onto 5 inch silicon wafers coated with 780 angstroms of ARC-29A (Brewer Science). A post-apply bake was performed at 110° C. for 60 seconds. Line-space patterns were imaged using a Ultratech 193 nm mini-stepper (0.6NA, chrome-on-glass mask). The exposed wafers were baked at 120° C. for 60 seconds and subsequently developed for 60 seconds with 0.26N TMAH developer (Optiyield CD, FujiFILM). The wafers were rinsed with deionized water and spun dry.

Figure 5:
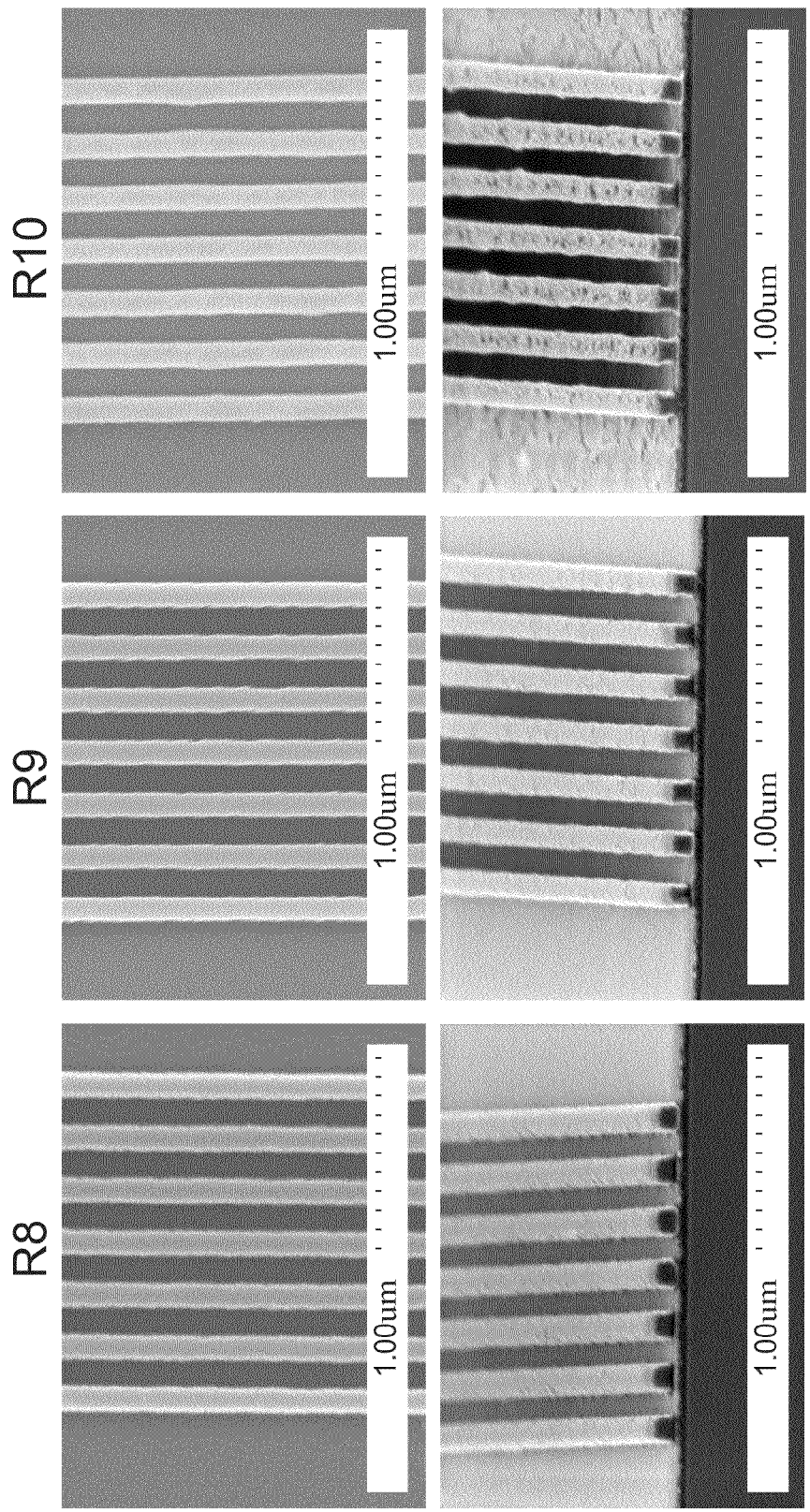
FIG. 5 is a collection of scanning electron micrographs showing 193 nm lithographic imaging of 140 nm half-pitch line-space patterns using photoresists R8-R10 of the present invention.

The imaging results with photoresists based on 2,2-diMe-EATf-MA (R8-R10) are shown in FIG. 5.

EXAMPLE 18

Solubility of Photoresists in Alcoholic Solvent

Individually, 5 wt % solutions of photoresists R2, R3, R6, R7, and R8 in 4-methyl-2-pentanol were prepared and filtered through a 0.2 µm PTFE filter. Films were spun cast on 2-inch silicon wafers at 2000 rpm for 40 seconds. After casting, the coated wafers were subjected to a post-application bake at 110° C. for 60 seconds. All photoresists (R2, R3, R6, R7, and R8) formed smooth uniform films when cast from 4-methyl-2-pentanol.

We claim:

1. A positive-tone photoresist composition comprising a polymer, a PAG, and a solvent, wherein the polymer includes a first repeat unit having a sulfonamide group and a branched linking group according to Formula (XII)

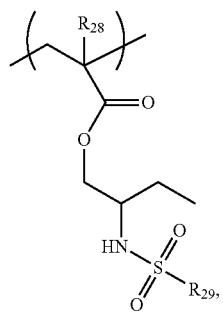

(XII)

and a second repeat unit that includes an acidic group protected by an acid-labile protecting group, wherein:
R28 is independently selected from the group consisting of hydrogen, fluorine, methyl, and trifluoromethyl; and
R29 is fluorinated C1-C12 alkyl.

2. The composition of claim 1, wherein R29 is selected from trifluoromethyl and perfluorobutyl.

3. The composition of claim 1, wherein the first repeat unit constitutes at least 5 mole % of the polymer.

4. The composition of claim 1, wherein the acidic group is selected from the group consisting of carboxylic acids, sulfonamides, phenols, and fluoroalcohols.

5. The composition of claim 1, wherein the protecting group is selected from the group consisting of tertiary esters, orthoesters, acetals, ketals, carbonates, silyl ethers, and silyl esters.

6. A positive-tone photoresist composition comprising a polymer, a PAG, and a solvent, wherein the polymer includes a first repeat unit having a sulfonamide group and a branched linking group according to Formula (VI)

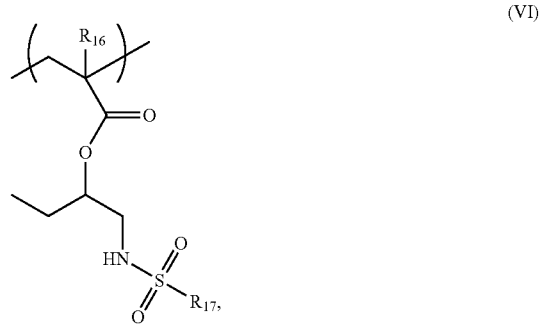

(VI)

and a second repeat unit that includes an acidic group protected by an acid-labile protecting group, wherein:
R16 is independently selected from the group consisting of hydrogen, fluorine, methyl, and trifluoromethyl; and
R17 is fluorinated C1-C12 alkyl.

7. The composition of claim 6, wherein R17 is selected from trifluoromethyl and perfluorobutyl.

8. The composition of claim 6, wherein the first repeat unit constitutes at least 5 mole % of the polymer.

9. The composition of claim 6, wherein the acidic group is selected from the group consisting of carboxylic acids, sulfonamides, phenols, and fluoroalcohols.

10. The composition of claim 6, wherein the protecting group is selected from the group consisting of tertiary esters, orthoesters, acetals, ketals, carbonates, silyl ethers, and silyl esters.

11. A positive-tone photoresist composition comprising a polymer, a PAG, and a solvent, wherein the polymer includes a first repeat unit having a sulfonamide group and a branched linking group, wherein the first repeat unit is selected from the group consisting of Formulas (IV) and (VII)-(IX)

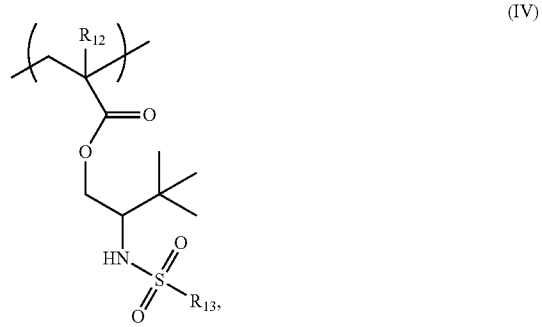

(IV)

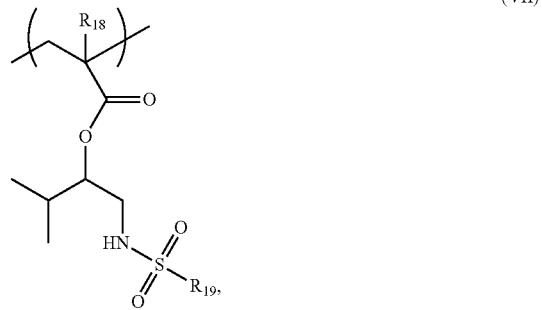

(VII)

31
-continued

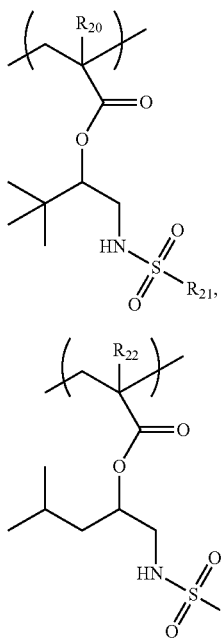

(VIII)

(IX)

and a second repeat unit that includes an acidic group protected by an acid-labile protecting group, wherein:
R12, R18, R20, and R22 are independently selected from the group consisting of hydrogen, fluorine, methyl, and trifluoromethyl; and
R13, R19, R21, and R23 are independently fluorinated C1-C12 alkyl.

12. The composition of claim 11, wherein R13, R19, R21, and R23 are independently selected from trifluoromethyl and perfluorobutyl.

13. The composition of claim 11, wherein the first repeat unit constitutes at least 5 mole % of the polymer.

14. The composition of claim 11, wherein the acidic group is selected from the group consisting of carboxylic acids, sulfonamides, phenols, and fluoroalcohols.

15. The composition of claim 11, wherein the protecting group is selected from the group consisting of tertiary esters, orthoesters, acetals, ketals, carbonates, silyl ethers, and silyl esters.

16. A positive-tone photoresist composition comprising a polymer, a PAG, and a solvent, wherein the polymer includes a first repeat unit having a sulfonamide group and a branched linking group, wherein the first repeat unit is selected from the group consisting of Formulas (II), (III), (V) and (XIII)

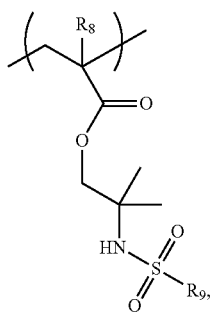

(II)

32
-continued

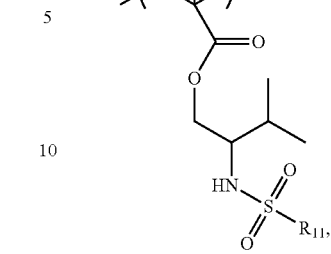

(III)

(V)

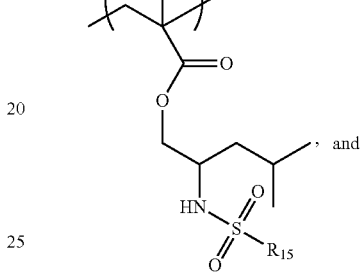

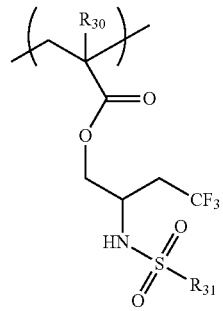

(XIII)

and a second repeat unit that includes an acidic group protected by an acid-labile protecting group, wherein:
R8, R10, R14, and R30 are independently selected from the group consisting of hydrogen, fluorine, methyl, and trifluoromethyl; and
R9, R11, R15, and R31 are independently fluorinated C1-C12 alkyl.

17. The composition of claim 16, wherein R9, R11, R15, and R31 are independently selected from trifluoromethyl and perfluorobutyl.

18. The composition of claim 16, wherein the first repeat unit constitutes at least 5 mole % of the polymer.

19. The composition of claim 16, wherein the acidic group is selected from the group consisting of carboxylic acids, sulfonamides, phenols, and fluoroalcohols.

20. The composition of claim 16, wherein the protecting group is selected from the group consisting of tertiary esters, orthoesters, acetals, ketals, carbonates, silyl ethers, and silyl esters.

21. A method of patterning a positive-tone photoresist comprising the steps of:
(a) applying on a substrate a layer of a positive-tone photoresist composition comprising a polymer, a PAG, and a solvent, wherein the polymer includes a first repeat unit having a sulfonamide group and a branched linking group according to Formula (I) and a second repeat unit that includes an acidic group protected by an acid-labile protecting group,

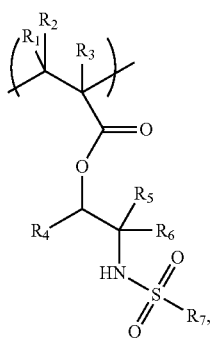

wherein,
R1 and R2 are independently selected from the group consisting of hydrogen, fluorine, methyl, and trifluoromethyl,
R3 is selected from the group consisting of hydrogen, a halogen, C1-C12 alkyl, and fluorinated C1-C12 alkyl,
R4, R5, and R6 are independently selected from hydrogen, fluorine, C1-C12 alkyl, and fluorinated C1-C12 alkyl, wherein at least one of R4, R5, and R6 includes carbon, and
R7 is fluorinated C1-C12 alkyl;
(b) optionally, baking the positive-tone photoresist;
(c) applying a layer of topcoat material to form a topcoat on the positive-tone photoresist;
(d) optionally, baking the topcoat;
(e) patternwise exposing the positive-tone photoresist;
(f) optionally, baking the exposed positive-tone photoresist; and
(g) developing the positive-tone photoresist to selectively remove the topcoat material and portions of the positive-tone photoresist
wherein the developing step comprises using an organic solvent to selectively remove the topcoat and exposed portions of the positive-tone photoresist to form a positive-tone image.

22. The method of claim 21, wherein the substrate comprises a patterned photoresist.

23. The method of claim 21, wherein patternwise exposure is carried out using 193 nm water immersion lithography.

24. The method of claim 21, wherein R7 is selected from trifluoromethyl and perfluorobutyl.

25. The method of claim 21, wherein the first repeat unit constitutes at least 5 mole % of the polymer.

26. The method of claim 21, wherein the composition comprises a polymer comprising a repeat unit according to Formula (X)

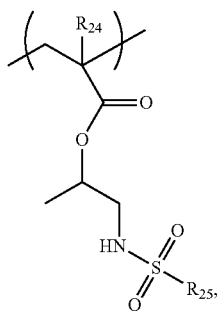

wherein:
R24 is independently selected from the group consisting of hydrogen, fluorine, methyl, and trifluoromethyl; and
R25 is fluorinated C1-C12 alkyl.

27. The method of claim 26, wherein R25 is selected from trifluoromethyl and perfluorobutyl.

28. The method of claim 21, wherein the composition comprises a polymer comprising a repeat unit according to Formula (XI)

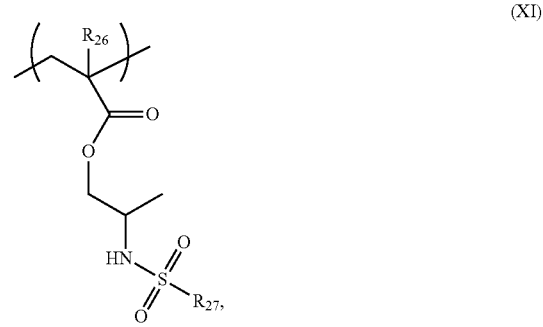

wherein:
R26 is independently selected from the group consisting of hydrogen, fluorine, methyl, and trifluoromethyl; and
R27 is fluorinated C1-C12 alkyl.

29. The method of claim 28, wherein R27 is selected from trifluoromethyl and perfluorobutyl.

30. The method of claim 21, wherein the acidic group is selected from the group consisting of carboxylic acids, sulfonamides, phenols, and fluoroalcohols.

31. The method of claim 21, wherein the protecting group is selected from the group consisting of tertiary esters, orthoesters, acetals, ketals, carbonates, silyl ethers, and silyl esters.

32. A method of patterning a positive-tone photoresist comprising the steps of:
(a) applying on a substrate a layer of a positive-tone photoresist composition comprising a polymer, a PAG, and a solvent, wherein the polymer includes a first repeat unit having a sulfonamide group and a branched linking group according to Formula (I) and a second repeat unit that includes an acidic group protected by an acid-labile protecting group,

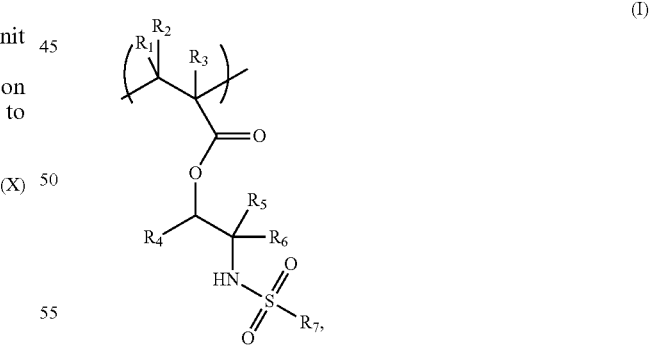

wherein,
R1 and R2 are independently selected from the group consisting of hydrogen, fluorine, methyl, and trifluoromethyl,
R3 is selected from the group consisting of hydrogen, a halogen, C1-C12 alkyl, and fluorinated C1-C12 alkyl,
R4, R5, and R6 are independently selected from hydrogen, fluorine, C1-C12 alkyl, and fluorinated C1-C12 alkyl, wherein at least one of R4, R5, and R6 includes carbon, and
R7 is fluorinated C1-C12 alkyl;

(b) optionally, baking the positive-tone photoresist;
(c) applying a layer of topcoat material to form a topcoat on the positive-tone photoresist;
(d) optionally, baking the topcoat;
(e) patternwise exposing the positive-tone photoresist;
(f) optionally, baking the exposed positive-tone photoresist; and
(g) developing the positive-tone photoresist to selectively remove the topcoat material and portions of the positive-tone photoresist,
wherein the developing step comprises using an organic solvent to selectively remove the topcoat and the unexposed portions of the positive-tone photoresist to form a negative-tone image.

33. The method of claim 32, wherein the substrate comprises a patterned photoresist.

34. The method of claim 32, wherein patternwise exposure is carried out using 193 nm water immersion lithography.

35. The method of claim 32, wherein R7 is selected from trifluoromethyl and perfluorobutyl.

36. The method of claim 32, wherein the composition comprises a polymer comprising a repeat unit according to Formula (X)

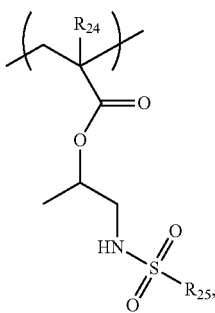

(X)

wherein:
R24 is independently selected from the group consisting of hydrogen, fluorine, methyl, and trifluoromethyl; and
R25 is fluorinated C1-C12 alkyl.

37. The method of claim 36, wherein R25 is selected from trifluoromethyl and perfluorobutyl.

38. The method of claim 32, wherein the composition comprises a polymer comprising a repeat unit according to Formula (XI)

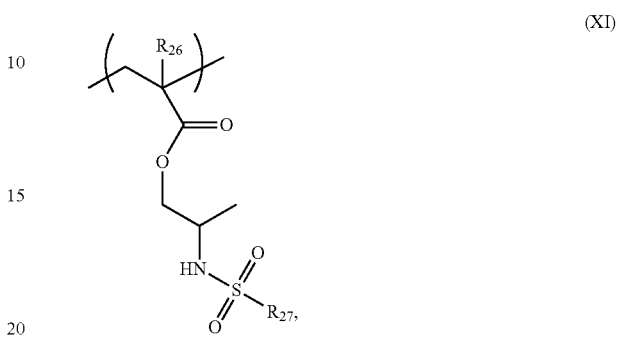

(XI)

wherein:
R26 is independently selected from the group consisting of hydrogen, fluorine, methyl, and trifluoromethyl; and
R27 is fluorinated C1-C12 alkyl.

39. The method of claim 38, wherein R27 is selected from trifluoromethyl and perfluorobutyl.

40. The method of claim 32, wherein the first repeat unit constitutes at least 5 mole % of the polymer.

41. The method of claim 32, wherein the acidic group is selected from the group consisting of carboxylic acids, sulfonamides, phenols, and fluoroalcohols.

42. The method of claim 32, wherein the protecting group is selected from the group consisting of tertiary esters, orthoesters, acetals, ketals, carbonates, silyl ethers, and silyl esters.

* * * * *